(12) United States Patent
O'Donnell et al.

(10) Patent No.: US 12,140,619 B2
(45) Date of Patent: Nov. 12, 2024

(54) SYSTEMS AND METHODS FOR CHARGE STORAGE AND PROVIDING POWER

(71) Applicant: Analog Devices International Unlimited Company, Limerick (IE)

(72) Inventors: Alan J. O'Donnell, Castletroy (IE); David Aherne, Limerick (IE); Javier Alejandro Salcedo, North Billerica, MA (US); David J. Clarke, Patrickswell (IE); John A. Cleary, Kilmallock (IE); Patrick Martin McGuinness, Pallaskenry (IE); Albert C. O'Grady, Mungret (IE)

(73) Assignee: Analog Devices International Unlimited Company, Limerick (IE)

( * ) Notice: Subject to any disclaimer, the term of this patent is extended or adjusted under 35 U.S.C. 154(b) by 22 days.

(21) Appl. No.: 18/188,363

(22) Filed: Mar. 22, 2023

(65) Prior Publication Data
US 2023/0221360 A1    Jul. 13, 2023

Related U.S. Application Data

(63) Continuation of application No. 17/456,307, filed on Nov. 23, 2021, now Pat. No. 11,644,497, which is a
(Continued)

(51) Int. Cl.
*H02J 7/00* (2006.01)
*G01R 31/00* (2006.01)
(Continued)

(52) U.S. Cl.
CPC ......... *G01R 31/002* (2013.01); *G08B 21/185* (2013.01); *H02H 1/0007* (2013.01);
(Continued)

(58) Field of Classification Search
CPC ...... G01R 31/00; G01R 31/002; G08B 21/18; G08B 21/185; H02H 1/00; H02H 9/04; H02H 3/20; H02H 9/046; H02H 1/0007
(Continued)

(56) References Cited

U.S. PATENT DOCUMENTS

| 4,726,991 A | 2/1988 | Hyatt et al. |
| 4,888,498 A | 12/1989 | Kadakia |

(Continued)

FOREIGN PATENT DOCUMENTS

| CN | 101083396 A | 12/2007 |
| CN | 101191803 | 6/2008 |

(Continued)

OTHER PUBLICATIONS

European Search Report of Aug. 5, 2016 for European Patent Application No. 16160442.6 filed Mar. 15, 2016, 7 pages.
(Continued)

*Primary Examiner* — Danny Nguyen
(74) *Attorney, Agent, or Firm* — Knobbe, Martens, Olson & Bear, LLP

(57) ABSTRACT

Aspects of this disclosure relate to detecting and recording information associated with electrical overstress (EOS) events, such as electrostatic discharge (ESD) events. For example, in one embodiment, an apparatus includes an electrical overstress protection device, a detection circuit configured to detect an occurrence of the EOS event, and a memory configured to store information indicative of the EOS event.

28 Claims, 27 Drawing Sheets

Related U.S. Application Data continuation of application No. 16/743,878, filed on Jan. 15, 2020, now Pat. No. 11,193,967, which is a continuation of application No. 15/801,132, filed on Nov. 1, 2017, now Pat. No. 10,557,881, which is a continuation of application No. 14/671,767, filed on Mar. 27, 2015, now Pat. No. 9,871,373.

(51) Int. Cl.
*G08B 21/18* (2006.01)
*H02H 1/00* (2006.01)
*H02H 9/04* (2006.01)
*H01L 27/02* (2006.01)
*H02H 3/04* (2006.01)
*H02H 3/20* (2006.01)
*H02H 9/00* (2006.01)
*H05K 1/02* (2006.01)

(52) U.S. Cl.
CPC .............. *H02H 9/046* (2013.01); *H02J 7/00* (2013.01); *H02J 7/00032* (2020.01); *H02J 7/0013* (2013.01); *H02J 7/0029* (2013.01); *H02J 7/0048* (2020.01); *H02J 7/00712* (2020.01); *H01L 27/0251* (2013.01); *H02H 3/04* (2013.01); *H02H 3/20* (2013.01); *H02H 9/005* (2013.01); *H02H 9/04* (2013.01); *H02H 9/042* (2013.01); *H05K 1/0259* (2013.01)

(58) Field of Classification Search
USPC ........................................ 361/56, 91.1, 111
See application file for complete search history.

(56) References Cited

U.S. PATENT DOCUMENTS

| | | |
|---|---|---|
| 5,315,472 A | 5/1994 | Fong et al. |
| 5,666,127 A | 9/1997 | Kochiyama et al. |
| 5,751,530 A | 5/1998 | Pelly et al. |
| 5,784,242 A | 7/1998 | Watt |
| 5,786,613 A | 7/1998 | Kalnitsky |
| 5,896,324 A | 4/1999 | Jang |
| 5,946,175 A | 8/1999 | Yu |
| 5,995,354 A | 11/1999 | Yu |
| 6,236,087 B1 | 5/2001 | Daly et al. |
| 6,249,410 B1 | 6/2001 | Ker et al. |
| 6,411,544 B1 | 6/2002 | Devin |
| 6,430,016 B1 | 8/2002 | Marr |
| 6,529,359 B1 | 3/2003 | Verhaege |
| 6,646,309 B1 | 11/2003 | Chen |
| 6,819,539 B1 | 11/2004 | Wright et al. |
| 6,898,061 B1 | 5/2005 | Kimber et al. |
| 6,920,026 B2 | 7/2005 | Chen et al. |
| 7,102,415 B1 | 9/2006 | Potanin |
| 7,142,400 B1 | 11/2006 | Williams et al. |
| 7,268,517 B2 | 9/2007 | Rahmel et al. |
| 7,274,545 B2 | 9/2007 | Marum et al. |
| 7,411,767 B2 | 8/2008 | Shao-Chang et al. |
| 7,414,438 B1 | 8/2008 | Nulsen |
| 7,514,804 B2 | 4/2009 | Wang |
| 7,570,468 B2 | 8/2009 | Bernard et al. |
| 7,593,202 B2 | 9/2009 | Khazhinsky et al. |
| 7,630,184 B2 | 12/2009 | Crain et al. |
| 7,791,481 B2 | 9/2010 | Landt et al. |
| 7,989,936 B2 | 8/2011 | McCain |
| 8,000,067 B1 | 8/2011 | Jin et al. |
| 8,068,319 B1 | 11/2011 | Chan |
| 8,112,138 B2 | 2/2012 | Reggiardo |
| 8,164,113 B2 | 4/2012 | Lin et al. |
| 8,169,760 B2 | 5/2012 | Chang et al. |
| 8,238,068 B2 | 8/2012 | Shannon et al. |
| 8,354,300 B2 | 1/2013 | Henderson et al. |
| 8,373,559 B2 | 2/2013 | McCain |
| 8,400,743 B2 | 3/2013 | Kosonocky et al. |
| 8,520,351 B2 | 8/2013 | Hong |
| 8,536,893 B2 | 9/2013 | Worley et al. |
| 8,582,261 B2 | 11/2013 | Salcedo et al. |
| 8,629,386 B2 | 1/2014 | Bermak et al. |
| 8,630,072 B2 | 1/2014 | Smith |
| 8,633,575 B1 | 1/2014 | Mangrum |
| 8,755,195 B2 | 6/2014 | Savory et al. |
| 8,796,729 B2 | 8/2014 | Clarke et al. |
| 8,853,799 B2 | 10/2014 | O'Donnell et al. |
| 8,957,488 B2 | 2/2015 | Keysar et al. |
| 9,164,826 B2 | 10/2015 | Fernandez |
| 9,184,569 B2 | 11/2015 | Ehrhardt et al. |
| 9,380,949 B2 | 7/2016 | Schuessler |
| 9,389,681 B2 | 7/2016 | Sankar et al. |
| 9,543,860 B2 | 1/2017 | Wang et al. |
| 9,575,111 B1 | 2/2017 | Karp et al. |
| 9,592,007 B2 | 3/2017 | Nuovo et al. |
| 9,608,429 B2 | 3/2017 | Welty |
| 9,775,520 B2 | 10/2017 | Tran |
| 9,787,088 B2 | 10/2017 | Sheikholeslami |
| 9,836,083 B2 | 12/2017 | Ricci |
| 9,858,773 B2 | 1/2018 | Deschamps |
| 9,871,373 B2 | 1/2018 | O'Donnell et al. |
| 9,972,894 B2 | 5/2018 | Dion et al. |
| 10,314,733 B2 | 6/2019 | Hyde et al. |
| 10,418,806 B2 | 9/2019 | Lopez Rodriguez et al. |
| 10,557,881 B2 | 2/2020 | O'Donnell et al. |
| 11,193,967 B2 | 12/2021 | O'Donnell et al. |
| 11,313,876 B2 | 4/2022 | Zhang et al. |
| 2002/0076840 A1 | 6/2002 | Englisch |
| 2004/0027159 A1 | 2/2004 | Oertle et al. |
| 2005/0127953 A1 | 6/2005 | Oertle et al. |
| 2006/0284302 A1 | 12/2006 | Kim et al. |
| 2007/0174171 A1 | 7/2007 | Enta |
| 2007/0230073 A1 | 10/2007 | Ker et al. |
| 2007/0297105 A1 | 12/2007 | Brennan et al. |
| 2008/0074817 A1 | 3/2008 | Crain et al. |
| 2008/0129523 A1 | 6/2008 | Assimos |
| 2008/0297939 A1 | 12/2008 | Amemiya |
| 2009/0287435 A1 | 11/2009 | Ker et al. |
| 2010/0141094 A1 | 6/2010 | Lee et al. |
| 2010/0271742 A1 | 10/2010 | Shannon et al. |
| 2010/0305792 A1* | 12/2010 | Wilk ..................... B60L 50/61 |
| | | 701/22 |
| 2011/0069419 A1 | 3/2011 | Su et al. |
| 2011/0209744 A1 | 9/2011 | Hu |
| 2011/0224508 A1 | 9/2011 | Moon |
| 2011/0261489 A1 | 10/2011 | Zupcau |
| 2012/0001163 A1 | 1/2012 | Kobayashi et al. |
| 2012/0017962 A1 | 1/2012 | Skotnicki et al. |
| 2012/0077291 A1 | 3/2012 | Pasveer et al. |
| 2012/0153437 A1 | 6/2012 | Chen et al. |
| 2012/0174582 A1 | 7/2012 | Moussavi |
| 2013/0044396 A1 | 2/2013 | Tsai et al. |
| 2013/0057111 A1 | 5/2013 | Mukter-Uz-Zaman et al. |
| 2013/0193918 A1 | 8/2013 | Sarkar et al. |
| 2014/0062381 A1 | 3/2014 | Teggatz et al. |
| 2014/0246066 A1 | 9/2014 | Chen et al. |
| 2014/0268440 A1 | 9/2014 | Chen et al. |
| 2014/0362481 A1 | 12/2014 | Prabhu et al. |
| 2015/0040677 A1 | 2/2015 | Hammerschmidt |
| 2015/0265217 A1 | 9/2015 | Penders et al. |
| 2015/0280415 A1 | 10/2015 | Welty |
| 2016/0009547 A1 | 1/2016 | Mason et al. |
| 2016/0110639 A1 | 4/2016 | Finn et al. |
| 2016/0172849 A1 | 6/2016 | Dibra et al. |
| 2016/0241054 A1* | 8/2016 | Matsumoto ......... H01M 10/482 |
| 2016/0285255 A1 | 9/2016 | O'Donnell |
| 2017/0054289 A1 | 2/2017 | Kuo |
| 2017/0143977 A1 | 5/2017 | Kaib et al. |
| 2017/0187187 A1 | 6/2017 | Amin et al. |
| 2017/0222432 A1 | 8/2017 | Iwasawa et al. |
| 2017/0351295 A1 | 12/2017 | Malhotra |
| 2018/0006448 A1 | 1/2018 | Glaser et al. |
| 2018/0062378 A1 | 3/2018 | Lee et al. |
| 2018/0078181 A1 | 3/2018 | Cronin et al. |

(56) References Cited

U.S. PATENT DOCUMENTS

| | | | |
|---|---|---|---|
| 2019/0138068 | A1 | 5/2019 | Park et al. |
| 2022/0082605 | A1 | 3/2022 | O'Donnell et al. |

FOREIGN PATENT DOCUMENTS

| | | |
|---|---|---|
| CN | 101350516 A | 1/2009 |
| CN | 102097788 A | 6/2011 |
| CN | 102201666 A | 9/2011 |
| CN | 102570902 A | 7/2012 |
| CN | 102576774 | 7/2012 |
| CN | 102769282 A | 11/2012 |
| CN | 202549831 U | 11/2012 |
| CN | 103490493 | 1/2014 |
| CN | 103872670 A | 6/2014 |
| EP | 2 280 458 | 2/2011 |
| EP | 2 333 925 | 6/2011 |
| JP | H04-152664 | 5/1992 |
| JP | H1198684 A | 4/1999 |
| JP | 2000-223685 | 8/2000 |
| JP | 2002-111041 | 4/2002 |
| JP | 2002-246514 | 8/2002 |
| JP | 2005-283389 | 10/2005 |
| JP | 2006-352136 | 12/2006 |
| JP | 2007234688 A | 9/2007 |
| JP | 2009-200189 | 2/2008 |
| JP | 2008-173462 | 7/2008 |
| JP | 2009-081160 | 4/2009 |
| KR | 20050084709 A | 8/2005 |
| KR | 20080034227 A | 4/2008 |
| TW | I427883 | 2/2014 |
| WO | WO 02/03085 | 1/2002 |
| WO | WO 2010/053997 | 5/2010 |
| WO | WO 2010/100929 | 9/2010 |
| WO | WO 2010/136919 | 12/2010 |

OTHER PUBLICATIONS

Gao, Xiaofang, et al., Abstract of "An improved electrostatic discharge protection structure for reducing triggering voltage and parasitic capacitance," Jun. 2003, Solid-State Electronics, vol. 47, Issue 6.

Haus, Hermann A., and James R. Melcher, *Electromagnetic Fields and Energy*, Chapter 6 (Massachusetts Institute of Technology: MIT OpenCourseWare). Available at: http://ocw.mit.edu/resources/res-6-001-electromagnetic-fields-and-energy-spring-2008/chapter-6/06.pdf (accessed Jul. 27, 2015). License: Creative Commons Attribution-NonCommercial-Share Alike. Also available from Prentice-Hall: Englewood Cliffs, NJ, 1989. ISBN: 9780132490207.

Huang, Gregory T., "Electroactive Polymers", MIT Technology Review, Dec. 1, 2002. Available at: http://www.technologyreview.com/article/401750/electroactive-polymers/ (accessed Jul. 27, 2015).

Ker, M.D. et al., "On-Chip ESD Detection Circuit for System-Level ESD Protection Design," In IEEE 10th Int'l Conf. on Solid-State and Integrated Circuit Technology (ICSICT), Dec. 2010, 4 pages.

Lee, Sanghyo, et al., "Triboelectric energy harvester based on wearable textile platforms employing various surface morphologies," Nano Energy, Mar. 2015, vol. 12, pp. 410-418.

Suzuki, Yuji, "Development of a MEMS Energy Harvester With High-Perfomance Polymer Electrets." Department of Mechanical Engineering, the University of Tokyo, Bunkyo-ku, Tokyo, Japan Jan. 2010, 6 pages. Available at: http://blog.nus.edu.sg/a0066807/files/2011/03/047_Suzuki_9922.pdf (accessed Jul. 27, 2015).

Taiwanese Office Action of Mar. 28, 2017 for Taiwanese Patent Application No. 105107769 filed Mar. 14, 2016.

Tasca, D.M., "Pulse Power Failure Modes in Semiconductors," IEEE Transactions on Nuclear Science, vol. 17, Issue 6, Dec. 1970, pp. 364-372.

Texas Instruments, "System-Level ESD/EMI Protection Guide, ESD/EMI Solutions," 2012, 41 pages, available at http://www.ti.com/lit/sg/sszb130b/sszb130b.pdf (accessed Feb. 21, 2017).

U.S. Department of Transportation, Federal Highway Administration Research and Technology, "Chapter 2, Traffic Detector Handbook: Third Edition—vol. 1," May 2006. Available at: http://www.fhwa.dot.gov/publications/research/operations/its/06108/02a.cfm (accessed Jul. 27, 2015).

Voldman, Steven H., "The State of the Art of Electrostatic Discharge Protection: Physics, Technology, Circuits, Design, Simulation, and Scaling," IEEE Journal of Solid-State Circuits, vol. 34, No. 9, Sep. 1999, pp. 1272-1282.

Wunsch, D.C & Bell, R.R., "Determination of Threshold Failure Levels of Semiconductor Diodes and Transistors Due to Pulse Voltages," IEEE Transactions on Nuclear Science, vol. 15, Issue 6, Dec. 1968, pp. 244-259.

Lee, Sanghyo, et al., "Triboelectric energy harvester based on wearable textile platforms employing various surface morphologies," *Nano Energy* (2015) 12, pp. 410-418.

Seung, Wanchul, et al., "Nanopatterned Textile-Based Wearable Triboelectric Nanogenerator," ACS Nano, 2015, vol. 9, No. 4, pp. 3501-3509.

Office Action of Jun. 5, 2018 for Chinese Patent Application No. 201610177529.X, 7 pages.

Office Action of Oct. 19, 2018 for Chinese Application No. 201610177529.X, 3 pages.

Office Action dated Jul. 14, 2021 for Chinese Application No. 201910445662.2.

Torres, Erick O., et al., "Electrostatic Energy-Harvesting and Battery-Charging CMOS System Prototype," IEEE, 10 pages, 2009.

Post, E. Rehmi, et al., "Electrostatic Power Harvesting in Textiles," Proc. ESA Annual Meeting on Electrostatics 2010, Paper G1, 10 pages.

Xie, Huiling, et al., "Feasibility of an Electrostatic Energy Harvesting Device for CFCs Aircraft," Science Direct, Procedia Engineering 99, pp. 1213-1222, 2015.

Office Action in Taiwanese Patent Application No. 106145962 dated Dec. 27, 2018.

Office Action dated Dec. 3, 2020 for Chinese Patent Application No. 201910445662.2.

Communication pursuant to Article 94(3) EPC dated Jul. 9, 2019 in European Patent Application No. 16 160 442.6.

Decision to grant a European patent pursuant to Article 97(1) EPC issued in European Application No. 16160442.6, dated Apr. 7, 2022.

Notification to Grant Patent Right issued in Chinese Application No. 201910445662.2, dated Apr. 13, 2022.

Office Action issued in Chinese Application No. 201910445662.2, dated Jan. 4, 2022.

Partial European Search Report issued in European Application No. 22155115.3, dated May 30, 2022.

Extended European Search Report issued in Application No. 22155115.3, dated Aug. 30, 2022.

Office Action issued in Chinese Application No. 201910310712.6, dated Oct. 31, 2022.

Office Action issued in Chinese Application No. 201910310712.6, dated May 20, 2023.

* cited by examiner

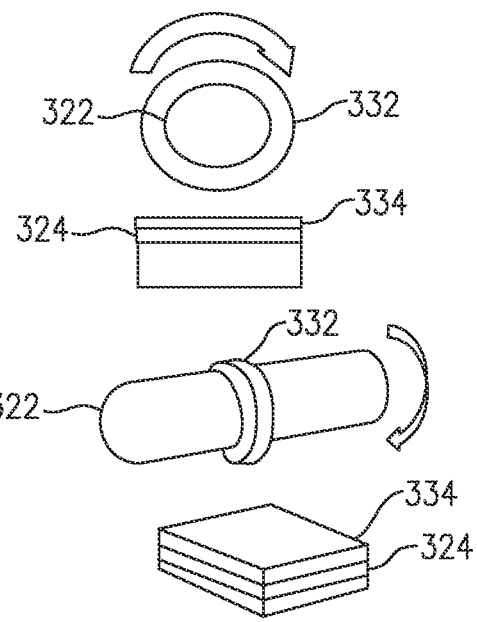
FIG.33A
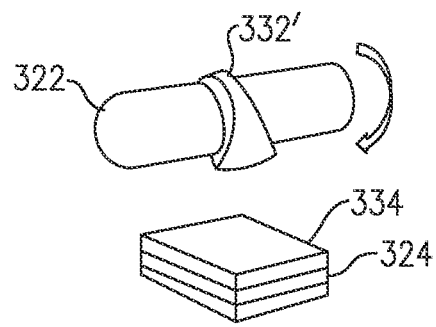
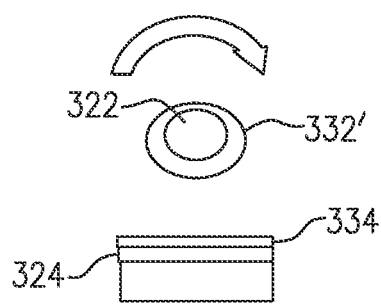
FIG.33B

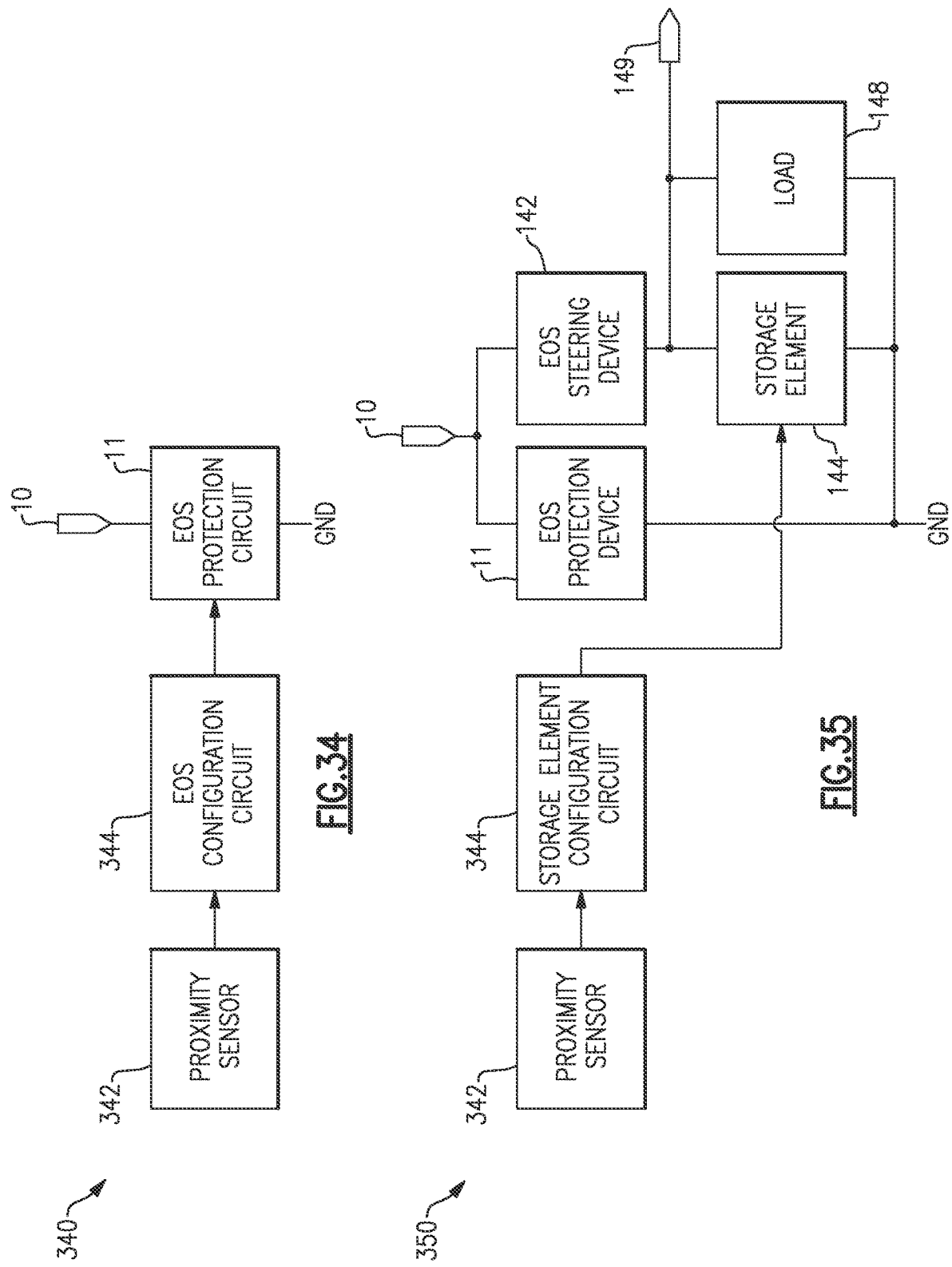

SYSTEMS AND METHODS FOR CHARGE STORAGE AND PROVIDING POWER

RELATED APPLICATIONS

This application is a continuation of U.S. application Ser. No. 17/456,307, filed Nov. 23, 2021, which is a continuation of U.S. application Ser. No. 16/743,878, filed Jan. 15, 2020, which is a continuation U.S. application Ser. No. 15/801, 132, filed Nov. 1, 2017, issued Feb. 11, 2020 as U.S. Pat. No. 10,557,881, which is a continuation of U.S. application Ser. No. 14/671,767, filed Mar. 27, 2015, issued Jan. 16, 2018 as U.S. Pat. No. 9,871,373, the disclosures of each of which are hereby incorporated by reference in their entireties herein.

BACKGROUND

Technical Field

The disclosed technology relates to electronic systems, and, more particularly, to taking action responsive to and/or in anticipation of an electrical overstress event.

Description of the Related Technology

Certain electronic systems can be exposed to electrical overstress events. Such events can cause damage, such as thermal damage, as a result of an electronic device experiencing a current and/or a voltage that is beyond the specified limits of the electronic device. For example, an electronic device can experience a transient signal event, or an electrical signal of short duration having rapidly changing voltage and high power. Transient signal events can include, for example, electrostatic discharge (ESD) events arising from the abrupt release of charge from an object or person to an electronic system, or a voltage/current spike from the electronic device's power source.

Electrical overstress events, such as transient signal events, can damage integrated circuits (ICs) due to overvoltage conditions and high levels of power dissipation in relatively small areas of the ICs, for example. High power dissipation can increase IC temperature, and can lead to numerous problems, such as gate oxide punch-through, junction damage, metal damage, surface charge accumulation, the like, or any combination thereof.

SUMMARY OF CERTAIN INVENTIVE ASPECTS

One aspect of this disclosure is an apparatus that includes an electrical overstress protection device, a detection circuit electrically coupled to the electrical overstress protection device, and a memory. The detection circuit is configured to detect an occurrence of an electrical overstress event. The memory is configured to store information indicative of the electrical overstress event detected by the detection circuit.

Another aspect of this disclosure is an apparatus that includes an electrical overstress protection device, a detection circuit electrically connected to the electrical overstress protection device, and a reporting circuit in communication with the detection circuit. The detection circuit is configured to detect an occurrence of an electrical overstress event. The reporting circuit is configured to provide information indicative of the electrical overstress event detected by the detection circuit.

Another aspect of this disclosure is an electronically-implemented method of recording information associated with an electrical overstress event. The method includes detecting, using detection circuitry electrically connected to an electrical overstress protection device, an occurrence of an electrical overstress event. The method also includes recording information associated with the occurrence of the electrical overstress event to a memory.

Another aspect of this disclosure is an apparatus that includes an electrical overstress steering device and a storage element configured to store charge associated with an electrical overstress event, in which the electrical overstress steering device is configured to provide energy associated with the electrical overstress event to the storage element.

The electrical overstress device can be disposed between a contact, such as a pin, of an electronic device and the storage element. An electrical overstress protection device can be electrically connected to the contact to provide electrical overstress protection. The storage element can include, for example, a capacitor. The electrical overstress steering device can be electrostatic discharge steering device and electrical overstress event can be an electrostatic discharge event.

Another aspect of this disclosure is an apparatus that includes a proximity sensor, an electrical overstress configuration circuit, and an electrical overstress protection circuit. Responsive receiving an indication of proximity from the proximity sensor, the electrical overstress configuration circuit can configure the electrical overstress protection circuit. For example, the electrical overstress configuration circuit can pre-trigger and/or prime the electrical overstress protection circuit.

Another aspect of this disclosure is an apparatus that includes a proximity sensor, a storage element, a storage element configuration circuit, and an electrical overstress steering device. The storage element can store charge associated with an electrical overstress event, in which the electrical overstress steering device is configured to provide energy associated with the electrical overstress event to the storage element. Responsive receiving an indication of proximity from the proximity sensor, the storage element configuration circuit can configure the storage element.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

BRIEF DESCRIPTION OF THE DRAWINGS

FIG. 33A illustrates a rotating shaft having a layer of material for enhancing electrostatic charge and/or field generated by a rotating shaft and a charge harvesting system according to an embodiment. FIG. 33B illustrates that the layer of material incorporated on a rotating shaft can have a non-uniform width in certain embodiments.

FIG. 34 is a schematic block diagram of an illustrative electronic device that can condition or initiate electrical overstress protection in response to proximity sensing information according to an embodiment.

FIG. 35 is a schematic block diagram of an illustrative electronic device that can configure a storage element arranged to store energy associated with an electrical overstress event using proximity sensing information according to an embodiment.

DETAILED DESCRIPTION OF CERTAIN EMBODIMENTS

Figure 1A:
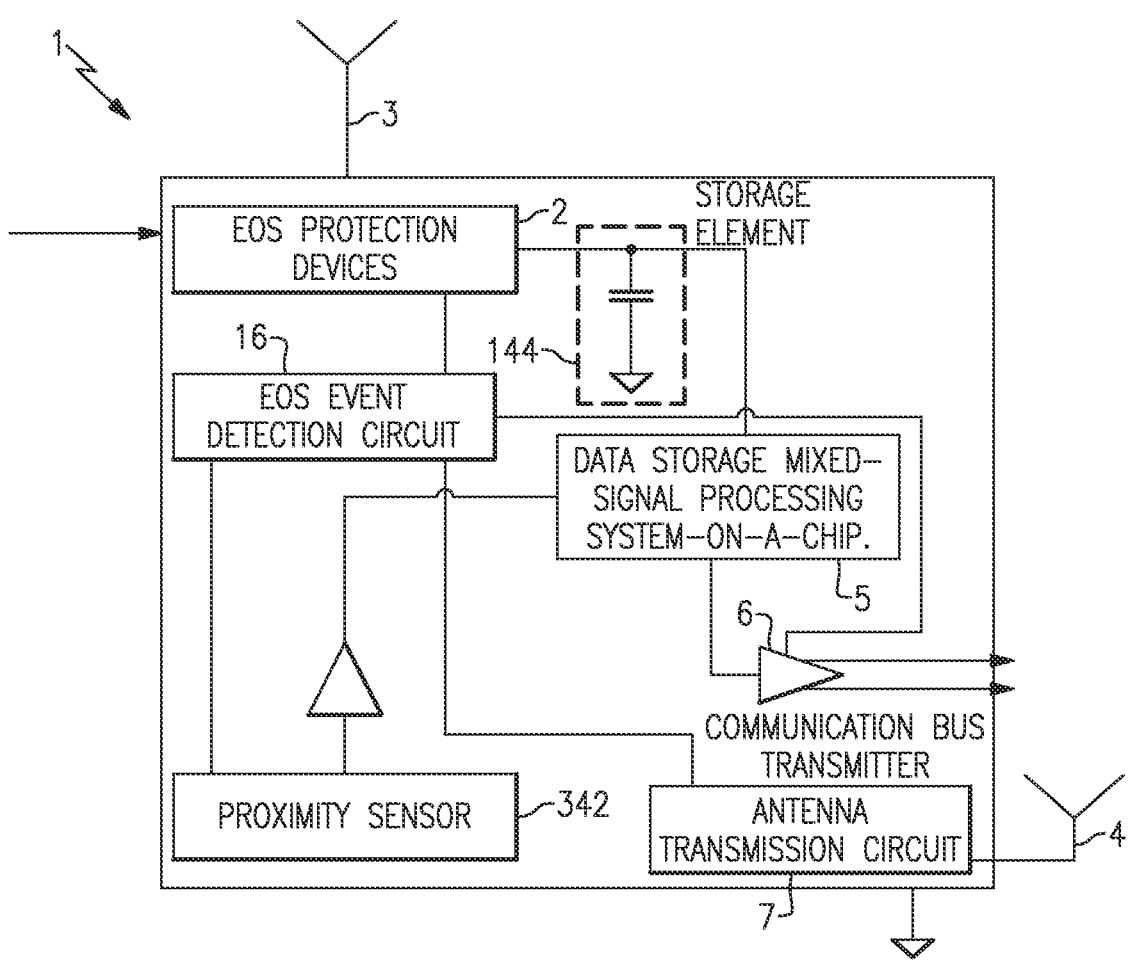
FIG. 1A is a schematic block diagram of an electronic system that includes electrical overstress detection circuitry, energy harvesting circuitry, and a proximity sensor according to an embodiment.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawings and/or a subset of the illustrated elements. Further, some embodiments can incorporate any suitable combination of features from two or more drawings. The headings provided herein are for convenience only and do not necessarily affect the scope or meaning of the claims.

Structures for protection against electrostatic discharge (ESD) or other electrical overstress events on an integrated circuit, such as a silicon chip, can occupy about 15% to about 20% of total integrated circuit area in certain applications. Over the last 40 years, structures used for the conduction, discharge/dissipation of static charge/ESD events have improved such that integrated circuits are able to withstand higher currents, higher voltages, transient events, etc. Such ESD protection structures can divert a signal surge to ground. While this disclosure may discuss ESD protection circuits and ESD events for illustrative purposes, it will be understood that any of the principles and advantages discussed herein can be applied to any other electrical overstress (EOS) condition. EOS events can encompass a variety of events including transient signal events lasting about 1 nanosecond or less, transient signal events lasting hundreds of nanoseconds, transient signal events lasting on the order of 1 microsecond, and direct current (DC) overstresses.

In this disclosure, detecting/recording/reporting electrical overstress events, harvesting energy associated with electrical overstress events, and configuring electrical overstress protection circuits responsive to an indication that an electrical overstress is likely to occur are disclosed. The principles and advantages of any one of these concepts can be applied in connection with one or more of the other concepts.

Typical ESD protection circuits can protect internal circuits from potentially damaging ESD events without storing or otherwise reporting that an ESD event has occurred. As such, information associated with the occurrence of an ESD event is unavailable to an electronic system. In certain applications, there is a need for reliable circuit operation. For instance, when electronics in a car or other vehicle fail, such failures can threaten safety of a driver and/or a passenger. As another example, it can be desirable for electronics in healthcare applications, such as heart rate monitoring applications, to reliably detect a change in a physiological parameter so that proper action can be taken responsive to detecting such a change. When circuits in such healthcare applications fail, health can be adversely impacted. In applications where there is a need for reliable circuit operation, unknown potential damage to critical circuits can be problematic.

Aspects of this disclosure relate to detecting and recording electrical overstress events. An electrical overstress event can be detected and information indicative of the electrical overstress event can be stored to memory and/or be reported external to an electronic device. Detection circuitry can detect an electrical overstress event and, in some instances, an intensity of the electrical overstress event. Physical memory can store information indicative of an intensity of an overstress event and/or a number of occurrences of electrical overstress events. The detection circuitry and the memory can be part of the same integrated circuit (e.g., on the same die and/or within the same package) as the electrical overstress protection circuitry. In an embodiment, the detection circuit and the memory can be implemented by a combined detection and memory circuit.

The information associated with the electrical overstress event stored in the memory can be useful for functional safety purposes. For instance, this information can serve as indication of wear or lifespan of the device, indicate that an electronic device is potentially damaged, that data provided by an electronic device is potentially corrupt, that a measurement provided by an electronic device is potentially inaccurate, the like, or any combination thereof. The information associated with an electrical overstress event can be reported to provide information about the functional safety of electrical overstress protection circuitry and/or of internal circuit(s) protected by the electrical overstress protection circuitry. The electronic overstress detection and reporting circuitry can provide an early indication of adverse conditions, analogous to a canary in a coal mine. In harsh environments, the electronic overstress detection and reporting circuitry can provide indicators of a lifespan of an electronic device and/or an electronic system. Tracking the lifespan of an electronic device by recording and reporting electrical overstress events can lead to better reliability of critical circuit and/or predictability of time for replacement. This can be advantageous in a variety of applications, such as in preventing failures in vehicles that threaten safety and/or in healthcare applications.

For instance, a custom semiconductor die operating in an electronic device can record information indicative of an occurrence of an electrical overstress (e.g., overvoltage and/or ESD) event in memory of the semiconductor die. The occurrence of the overstress event may indicate that there is a fault within the electronic device. The occurrence of the electrical overstress event may indicate that external protection circuitry, i.e., circuitry connected to the custom semiconductor die, such as separate protection circuitry on another chip or on a board, is faulty such that a semiconductor die experiences surges and/or current spikes outside of a specification for circuitry to be protected, which can be on the custom semiconductor die or outside of the custom semiconductor die. As an example, a solder joint for the external protection circuitry can degrade and thus provide less than desirable protection from an overvoltage event. The semiconductor die can provide the information indicative of the occurrence of the electrical overstress event external to the semiconductor die and/or external to an electronic device that includes the semiconductor die. This can serve as a diagnostic to inform an electronic system that electrical overstress protection circuitry is no longer functioning at a desired level.

A specialized semiconductor die can be devoted to handling electrical overstress, including detection and recording information indicative of overstress events in a memory of the semiconductor die. The specialized semiconductor die can also serve to harvest energy associated with EOS events and/or to provide EOS protection. In certain implementations, recording functions can be implemented on a different semiconductor die than EOS protection functions.

In some instances, an integrated circuit may have a limited/defined life span. This can result from, for example, being in a harsh electrical environment. The electrical overstress detection and reporting circuitry can provide information about an intensity of an electrical overstress event and/or a number of occurrences of electrical overstress events as flags to an electronic system. After a defined number of electrical overstress events have been detected, the electronic system can provide a flag that an electronic device has a reduced lifespan. Such a flag can indicate that the electronic device is due for replacement relatively soon or within a defined period of time. Tracking the lifespan of a device can lead to better reliability of critical circuits and/or a better prediction of time for replacement.

Information indicative of electrical overstress events can be provided externally to an electronic device that experiences the electrical overstress events or to separate monitoring circuitry or devices. For instance, wireless and/or inductive circuits can provide signal remote to the electronic device to provide a warning and/or a status of the heath of the electronic device or an electronic system that includes the electronic device. Such warnings can provide indicators of the life span of the system and/or general system health. This can enable planning for a new/replacement electronic device to be included in the electronic system. These principles and advantages can be applied to a variety of electronic systems, such as electronic systems in cars and/or other vehicles and/or in healthcare applications.

Aspects of this disclosure relate to storing charge associated with electrical overstress events, such as ESD events. ESD protection circuits, which can protect internal circuits from overvoltage events, typically divert charge to ground. A significant amount of energy can be associated with an ESD event. Instead of dissipating all charge associated with ESD events, a significant amount of the charge can be stored in a storage element, such as capacitor(s), and the stored charge can then be used by the electronic system. For example, such storage elements can be employed to supply power for events such as periodic wireless transmissions, to smooth out power delivery, to supplement or replace battery power, or any combination thereof. To facilitate storing change associated with ESD events, ESD protection structures can be scaled up (e.g., configured to carry more current and/or conduct/funnel more energy). While ESD events may be described in connection with harvesting change, it will be understood that charge can be harvested from any other EOS event in accordance with the principles and advantages discussed herein.

At a system level, electrical overstress protection circuits can be segregated (e.g., chips or layers in a package can be devoted to EOS event handling) and/or scaled up. Such electrical overstress protection circuits can be configured such that they provide system level electrical overstress protection; energy associated with electrical overstress events can be routed to a storage element; and/or EOS events can be detected and recorded. Charge stored by the storage element can be subsequently used within the system. In some instances, system level electrical overstress protection circuits and storage elements that store harvested energy from electrical overstress events can be implemented in industrial applications or other instances where current surges or other electrical overstress events are expected. In such instances, an electronic system can be arranged to harvest charge from moving/rotating mechanisms prone to generation of static charge, for example.

In situations where an electronic device operates intermittently, the charge associated with an electrical overstress event that is stored by a storage element can be used to carry out another specific/defined function. For example, responsive to an ESD event, the harvested charge can be used to activate circuitry and record, for example, that an ESD event has occurred. Similarly, in situations where temporary/transient charge harvested from, for example, an ESD event is sufficient to carry out a task, an electronic device can carry out the task using the harvested charge. In certain applications, responsive to an ESD event, harvested charge can be used to activate circuitry and record information associated with the ESD event, for example, in accordance with the principles and advantages discussed herein associated with detecting an EOS event.

At a micro level, if 15% to 20% of die area that is already consumed by ESD protection circuitry is used to reduce power consumption of a semiconductor chip and there are a number of such chips within an electronic system, then over power consumption and system efficiency can be significantly improved by storing and subsequently using charge associated with an ESD event. For example, even a relatively small reduction in power consumption in a system with a relatively large number of chips (e.g., 500 chips) can add up over a long period of time (e.g., 5 to 10 years). The charge stored from harvesting can be employed to prolong battery life for the system, particularly for remote monitoring systems, to reduce power consumption from external sources, to power circuitry for recording EOS events, etc.

Harvesting charge associated with electrical overstress events can be implemented in a number of different contexts. For example, harvesting charge associated with ESD or other electrical overstress events can be implemented in certain industrial applications where a system could be constructed specifically to generate and store charge from moving and/or rotating parts.

A storage element that receives and stores energy associated with an electrical overstress event can include capacitor(s) and/or a battery. For instance, the storage element can include a super capacitor and/or thin film lithium ion battery. In these storage elements, leakage can be a concern, particularly when charge is intermittently harvested.

The storage element can be constructed to enhance (e.g., optimize) the flow of current into the storage areas. The storage element can be arranged such that current associated with an electrical overstress event can only flow in one direction during the storing phase, i.e., once the current flows into the storage area it does not flow back out the same path/conduit/channel. A level of charge stored by the storage element can be detected. The storage element can provide a signal indicative of how much charge is stored by the storage element. This signal can be used, for example, to indicate that the storage element has sufficient charge to provide to an electronic system. Information about the amount of charge stored by the storage element can be provided to other circuitry, such as remote circuitry external to a die that includes the storage element and/or remote to an electronic system that includes the storage element. The storage element can be activated or otherwise configured to be responsive to an indication that an EOS event is likely to occur. Different banks of storage components, such as capacitors, can be switched on and/or off as they charge. When a bank of storage components stores approximately a maximum amount of charge, charge associated with an EOS event can be routed to a different bank of storage elements.

In some applications, an electronic system can be powered by a combination of energy harvested from an electrical overstress event and a primary power source. When harvested energy is available, it can used to power the electronic system. When the stored energy is depleted, the system can switch to using the primary power source until harvested energy becomes available. When using an energy harvesting, voltage on a capacitor in the storage element can be monitored. Responsive to detecting that sufficient charge is stored on the capacitor, an interrupt can be provided to inform the system sufficient energy is available to transmit a signal from the electronic system.

Aspects of this disclosure relate to detecting proximity of an electrical field and configuring circuitry for EOS protection and/or harvesting energy from an EOS event responsive to detecting proximity. For instance, an EOS device can be conditioned, e.g., primed to trigger in response to an indication that an EOS event is likely to occur as a result of sensing proximity. Such features can be implemented in applications in which EOS events occur for very short durations, e.g., on the order of nanoseconds or a shorter duration of time, such that the charge from such rapid events may not be captured without predictive triggering. As another example, clamping of an ESD protection circuit can be actively controlled responsive to detecting proximity. In one more example, a storage element can be activated to capture charge associated with an EOS event responsive to detecting proximity.

FIG. 1A is a schematic block diagram of an electronic system 1 that includes electrical overstress detection circuitry, energy harvesting circuitry, and a proximity sensor according to an embodiment. The electronic system 1 can be a system on a chip as illustrated. The electronic system 1 is an example of a system that can implement features of EOS event detection, harvesting energy associated with EOS events, and configuring EOS devices and/or storage elements for harvested energy based on proximity sensing information. The electronic system 1 of FIG. 1A includes EOS protection devices 2, antennas 3 and 4, an EOS event detection circuit 16, a reporting circuit 18, a storage element 144, a data storage and processing circuit 5, a communication bus transmitter circuit 6, an antenna transmission circuit 7, and a proximity sensor 342. Some other embodiments can include more elements than illustrated and/or a subset of the illustrated elements.

EOS protection devices 2 can provide EOS protection for internal circuits of the electronic system. The EOS protection devices can implement one or more EOS sense devices, such as the EOS sense device 14 of FIG. 1B or the ESD sense device 34 of FIG. 3, and one or more EOS steering devices, such as the ESD steering device 32 of FIG. 3 or the EOS steering device 142 of FIG. 14 or FIG. 15.

The EOS event detection circuit 16 can detect an occurrence of an EOS event. In some embodiments, the EOS detection circuit 16 can detect an intensity and/or a duration of an EOS event. The EOS event detection circuit 16 can provide information associated with an EOS event to the data storage and processing circuit 5 to be recorded. The EOS event detection circuit 16 can provide information associated with an EOS event to the antenna transmission circuit, which can transmit such information via the antenna 4. The EOS event information can alternatively or additionally provide information associated with an EOS event to the communication bus transmitter 6 for transmission by way of a communications bus. In an embodiment, the communication bus transmitter 6 can be part of a transceiver.

The storage element 144 can storage energy associated with an EOS event. The storage element 144 can include one or more capacitors, for example. Charge stored by the storage element 144 can power other circuits of the electronic system 1 and/or be provided external to the electronic system 1.

The proximity sensor 342 can sense proximity of an object and provide proximity information to the EOS event detection circuit 16 and/or the data stage and processing circuit 5. Using proximity information, these circuits can configure one or more of the EOS protection devices 2 and/or the storage element.

Detecting Electrical Overstress Events

As discussed above, aspects of this disclosure relate to detecting electrical overstress events, such as ESD events. Information associated with EOS events can be recorded and/or reported. This can provide information about the functional safety of a circuit, a die, an integrated circuit system, or the like. Such information can be indicative of an intensity of an EOS event, a duration of an EOS event, and/or of a number of occurrences of EOS events detected. In some embodiments, information associated with EOS events can be indicative of a pulse width of an EOS event, as an EOS event can have an arbitrary waveform. Such information can be recorded for each EOS pulse and/or multiple records can be captured per pulse. Illustrative embodiments related to EOS event detection will now be discussed.

Figure 1B:
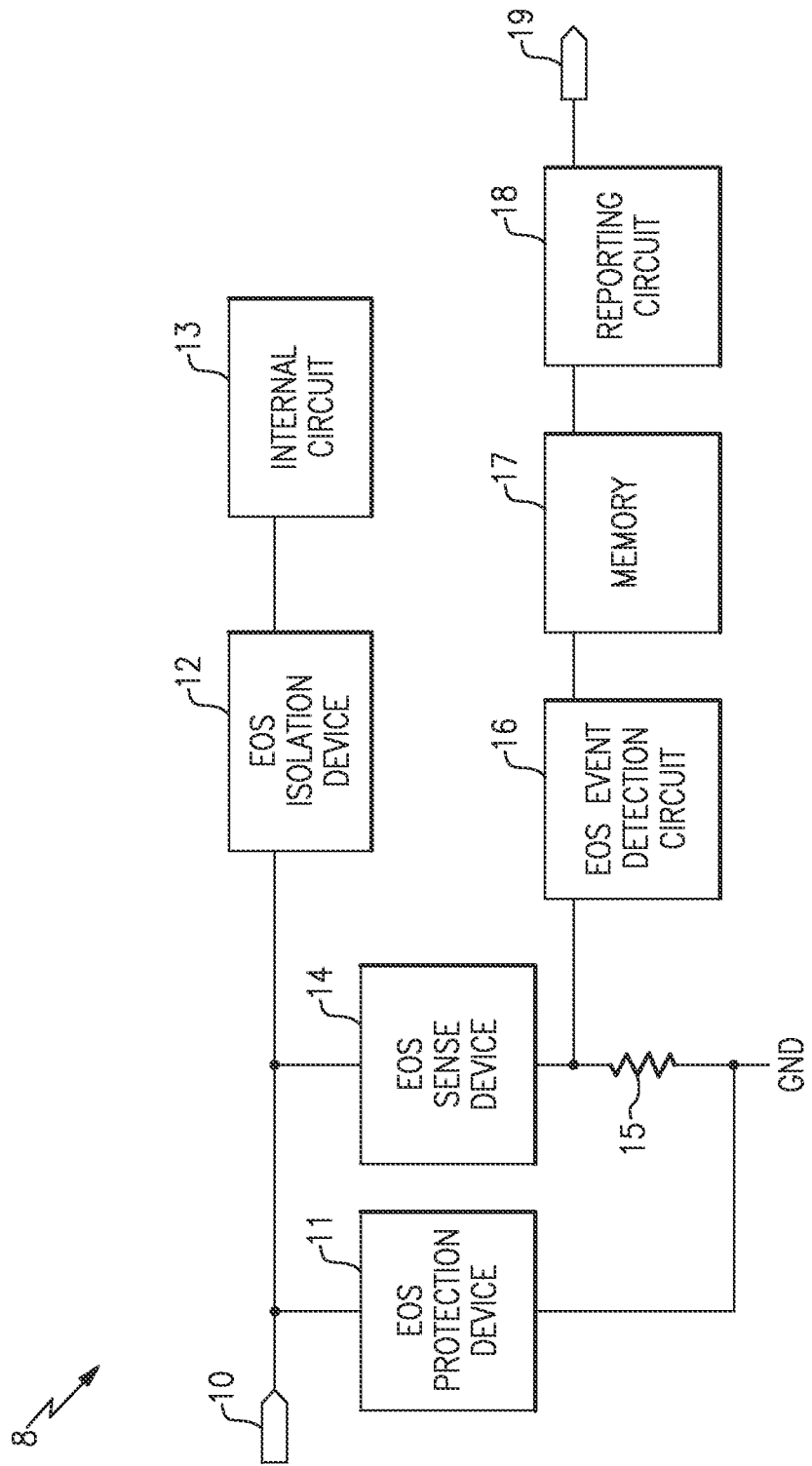
FIG. 1B is a schematic diagram of an illustrative electronic device that includes electrical overstress detection circuitry according to an embodiment.

FIG. 1B is a schematic diagram of an illustrative electronic device 8 that includes electrical overstress detection circuitry according to an embodiment. The electronic device 8 can be implemented in a variety of applications. As some examples, the electronic device 8 and/or other electronic devices discussed herein can be included in an automotive electronics system, an avionics electronics system, a healthcare monitoring electronics system, or the like. As illustrated, the electronic device 8 includes an input contact 10, an EOS protection device 11, an EOS isolation device 12, an internal circuit 13, an EOS sense device 14, a resistive element 15, a detection circuit 16, a memory 17, a reporting circuit 18, and an output contact 19. The illustrated elements of the electronic device 8 can be included within a single package. The electronic device 8 can include more elements than illustrated and/or a subset of the illustrated elements. The electronic device 10 can be a die, for example. As such, in some instances, the illustrated elements of the electronic device 8 can be embodied on a single die.

The electronic device 8 is configured to receive an input signal at the input contact 10, which can be an input pin as illustrated. The EOS protection device 11 is configured to provide protection from electrical overstress events. The illustrated EOS protection device 11 is configured to protect the circuitry electrically connected to the input contact 10 by diverting current associated with an EOS event to ground when a signal on the input contact 10 exceeds an EOS capability of the devices being protected, e.g., voltage breakdown. The EOS protection device 11 can protect the internal circuit 13 and the resistive element 15 from electrical overstress events. The EOS protection device 11 can also protect any other circuitry electrically connected to the input contact 10. The EOS isolation device 12 is disposed between the internal circuit 13 and the pin in FIG. 1B. The EOS isolation device 12 can be, for example, a resistor. In FIG. 1B, the EOS protection device 11 is disposed between the input contact 10 and ground. The EOS protection device 11 can be disposed between the input contact 10 and any other suitable low voltage reference. The EOS protection device 11 can be an ESD protection device configured to provide ESD protection, for example.

The EOS sense device 14 is an EOS protection device. For instance, the EOS sense device 14 can be a high impedance scaled down version of the EOS protection device 11. The EOS sense device 14 can be arranged to trigger at a signal level at which an EOS event is considered to occur. A relatively small percentage of the EOS event current can be provided through the resistive element 15 for purposes of detecting a magnitude of the EOS event. Accordingly, the signal provided to the detection circuit 16 by way of the EOS sense device 14 can be a scaled down version of a signal associated with an EOS event.

The resistive element 15 can be electrically coupled between the EOS sense device 14 and ground. This can provide a voltage drop such that a signal provided to the detection circuitry can be at a lower voltage than a voltage associated with the electrical overstress event, for example. The resistive element 14 can have a relatively low resistance (for example, about 1 Ohm in certain applications) and consequently the detection circuit 16 can receive a voltage signal that is at a lower voltage level (for example, a few volts) than a voltage associated with the electrical overstress event. The voltage drop provided by the resistive element 15 can prevent the detection circuit 16 from being damaged by the electrical overstress event.

As illustrated, the detection circuit 16 is electrically coupled to the EOS sense device 14 and configured to detect an occurrence of an electrical overstress event. For example, the detection circuit 16 can include a comparator configured to compare a voltage associated with an electrical overstress event with a reference voltage. Such a comparator can generate an indication that an electrical overstress event has occurred. The detection circuit 16 can detect an intensity, such as a voltage level and/or a current level, associated with the electrical overstress event using one or more comparators and/or an analog-to-digital converter according to certain embodiments.

In certain embodiments, the detection circuit 16 can include circuitry, such as a counter circuit, to determine a duration of an EOS event. The duration of an EOS pulse can be indicative of an amount of energy associated with the EOS event. By detecting a duration of an EOS pulse, the detection circuit 16 can differentiate between different types of EOS events, such as long DC pulses versus short transient pulses. The different types of EOS events can have varying impacts on the functional safety of an electronic system exposed to such EOS events. Accordingly, detecting the duration of an EOS event can provide additional information about the functional safety of an electronic system in certain applications.

The detection circuit 16 can provide information indicative of an electrical overstress event to the memory 17. The memory 17 can include any suitable physical circuitry to store such information, such as volatile memory or non-volatile memory. In certain embodiments, the memory 17 can include fuse elements. The memory 17 can store information indicative of the EOS event. For example, the memory 17 can store information indicative of an intensity of one or more EOS events, information indicative of a number of EOS events detected by the detection circuit 16, information indicative of a type of EOS event, information indicative of a duration of an EOS event, the like, or any combination thereof.

The reporting circuit 18 can provide information indicative of one or more electrical over-stress events to external circuitry, such as circuitry external to the electronic device 1. As illustrated, the reporting circuit 18 can receive such information from the memory 17. In some other embodiments, the reporting circuit 18 can receive such information from the detection circuit 16 without the information being stored to memory of the electronic device 10 and report the information. The reporting circuit 18 can provide the information indicative of one or more electrical overstress events to the output contact 19, which can be a pin as illustrated. According to certain embodiments, the reporting circuit 18 can wirelessly transmit such information and/or inductively transmit such information. The reporting circuit 18 can include the antenna transmission circuit 7 and/or the communication bus transmitter 6 of FIG. 1A in certain embodiments.

Electrostatic discharge protection devices are examples of electrical overstress protection devices, such as the EOS protection devices shown in FIG. 1B and/or other figures. FIGS. 2A to 2D illustrate example electrostatic discharge protection devices that can be implemented in one or more embodiments. Any of the electrostatic discharge protection devices illustrated in FIGS. 2A to 2D can be implemented in connection with any suitable embodiment related to electrical overstress event detection, harvesting energy associated with an electrical overstress event, configuring an electrical overstress protection device and/or a storage element responsive to an indication that an electrical overstress event is likely to occur, or any combination thereof.

Figure 2A:
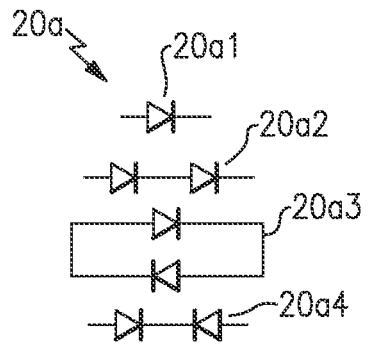
FIGS. 2A to 2D illustrate example electrical overstress protection devices that can be implemented in one or more embodiments.

FIG. 2A illustrates diode-based ESD protection devices 20a. FIG. 2A illustrates a unidirectional blocking junction diode 20a1, series-forward blocking junction diodes 20a2 for proportional increase of forward-biased conduction and reverse blocking voltage, antiparallel low voltage drop-conduction and decoupling diodes 20a3, and a high back-to-back diode-based bidirectional blocking device 20a4.

Figure 2B:
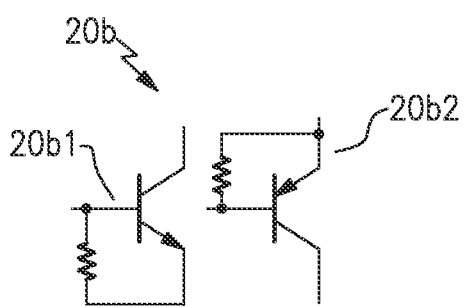

FIG. 2B illustrates bipolar transistor-based ESD protection devices 20b including an NPN ESD device 20b1 and a PNP ESD device 20b2. From collector to emitter (NPN) and emitter to collector (PNP), the bipolar transistors function as relatively high blocking voltage elements until reaching a breakdown voltage, at which point the device triggers and provides a low conduction path and high holding voltage between its terminals. In the opposite voltage polarity, a forward-biased junction is obtained.

Figure 2C:
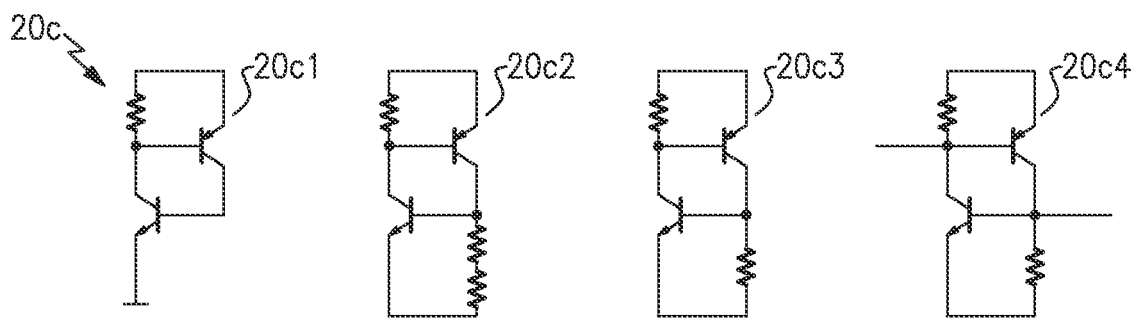

FIG. 2C illustrates coupled unidirectional NPN and PNP thyristor-like ESD protection devices 20c. The ESD protection devices shown in FIG. 2C can be referred to as semiconductor-controlled rectifiers. In some instances, semiconductor-controlled rectifiers are silicon-controlled rectifiers (SCRs). The NPN and PNP thyristor-like ESD devices include configurations with: floating NPN base 20c1, leading to a lower trigger voltage; an NPN in collector-emitter breakdown voltage mode with base-emitter resistance 20c2, leading to an intermediate trigger voltage; a traditional configuration with fixed base resistance 20c3 for highest thyristor trigger voltage; and thyristor bipolar base external latch trigger and latch release control 20c4.

Figure 2D:
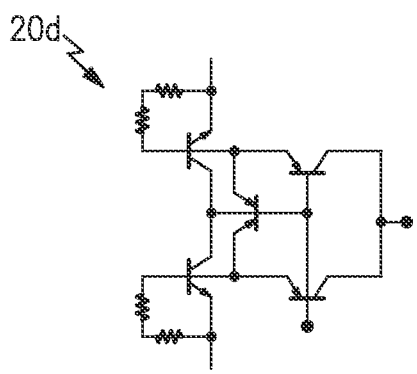

FIG. 2D illustrates a coupled NPN-PNP-NPN bi-directional high blocking thyristor-like ESD protection device 20d. The bidirectional breakdown voltage in this device can be closely defined by the base-emitter junction of the PNP device illustrated in the center of this device.

Figure 3:
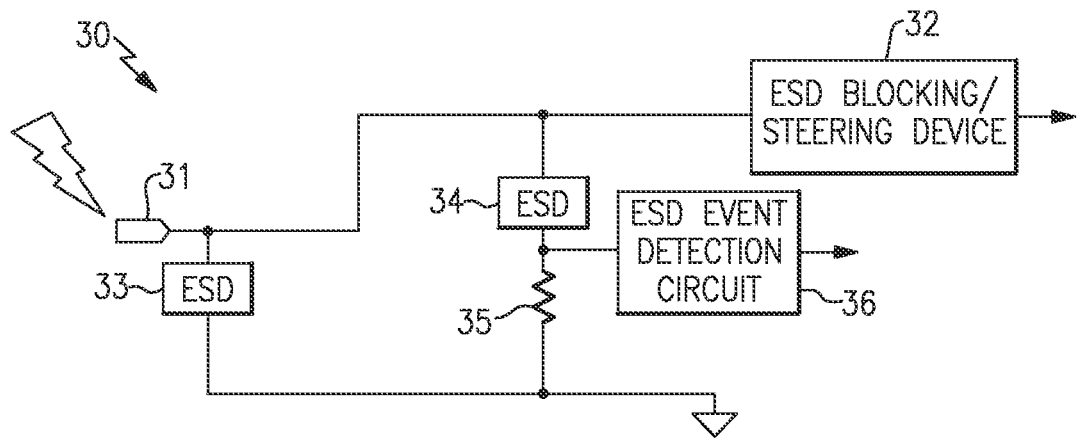
FIG. 3 is a schematic diagram of a portion of an illustrative electronic device configured to detect an electrical overstress event at a pin of the electronic device according to an embodiment.

EOS events can be detected at various nodes in an electronic device in accordance with the principles and advantages discussed herein. The EOS event detection discussed herein can be sensed at a pin of an electronic device in certain embodiments. FIG. 3 is a schematic diagram of a portion of an illustrative electronic device 30 configured to detect an electrostatic discharge event at a pin 31 of the electronic device 30 according to an embodiment. As shown in FIG. 3, an ESD event can occur at the pin 31, which can be any suitable input/output (I/O) pin, and the ESD event can be sensed at the pin 31. An ESD sense device 34 can be disposed between the pin 31 and ESD event detection circuit 36, which is an example of the detection circuit 16 of FIG. 1B. The ESD event detection circuit 36 can provide information indicative of an occurrence of an ESD event to a memory and/or reporting circuit (not illustrated) similar to in FIG. 1B. In FIG. 3, resistor 35 is disposed between the ESD sense device 34 and ground. As illustrated, the resistor is also disposed between an input to the ESD event detection circuit 36 and ground. An ESD protection device 33 can protect the ESD sense device 34 and the resistor 35. The ESD protection device 33 can also protect any other circuitry electrically connected to the pin 31. The ESD protection device 33 is in parallel with the series combination of the ESD sense device 34 and the resistor 35 in FIG. 3. An ESD blocking/steering device 32 can be disposed between the pin 31 and an internal circuit (not illustrated).

Figure 4:
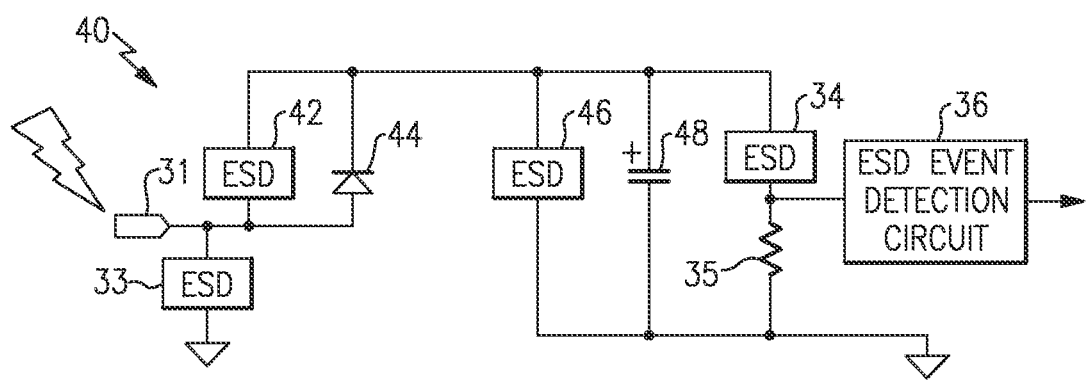
FIG. 4 is a schematic diagram of a portion of an illustrative electronic device configured to detect electrical overstress events across a storage element according to an embodiment.

EOS events can alternatively or additionally be sensed across certain circuit elements. Accordingly, information indicative of the functional safety of certain circuit elements can be recorded and/or reported. FIG. 4 is a schematic diagram of a portion of an illustrative electronic device 40 configured to detect an electrostatic discharge event across a storage element according to an embodiment. In FIG. 4, energy associated with an ESD event can be stored as charge across a capacitor 48. More details regarding such energy harvesting will be provided later. The ESD event detection circuit 36 of FIG. 4 can detect an ESD event across the capacitor 48. The ESD event detection circuit 36 of FIG. 4 can include a counter to track the number of ESD events detected across the capacitor 48. The ESD event detection circuit 36 of FIG. 4 can detect an intensity of an ESD event, for example, by detecting a voltage across resistor 35 associated with the ESD event. In FIG. 4, the first ESD protection device 34 and the resistor 35 function similar to in FIG. 3. The first ESD protection device 34 can be a high impedance ESD protection device, which can be triggered by a level of an ESD event that is desired to monitor. As such, the first ESD protection device 34 need not match the other illustrated ESD protection devices 33, 42, and/or 46 and/or the diode 44. The high impedance of the first ESD protection device 34 can limit current through the resistor 35 and may conduct a relatively small percentage of current associated with an ESD event.

Various detection circuits 36 can be implemented to detect an EOS event. The detection circuit 36 can include any suitable circuit configured to detect an EOS. Four illustrative detection circuits 36a, 36b, 36c, and 36d will be described with reference to FIGS. 5, 6, 7, and 8, respectively. These detection circuits are example detection circuits that can be implemented in connection with any of the principles and advantages discussed herein, for example, with reference to FIGS. 1, 3, and/or 4. Moreover, features of the any of the example detection circuits can be implemented in combination with any of the other example detection circuits.

Figure 5:
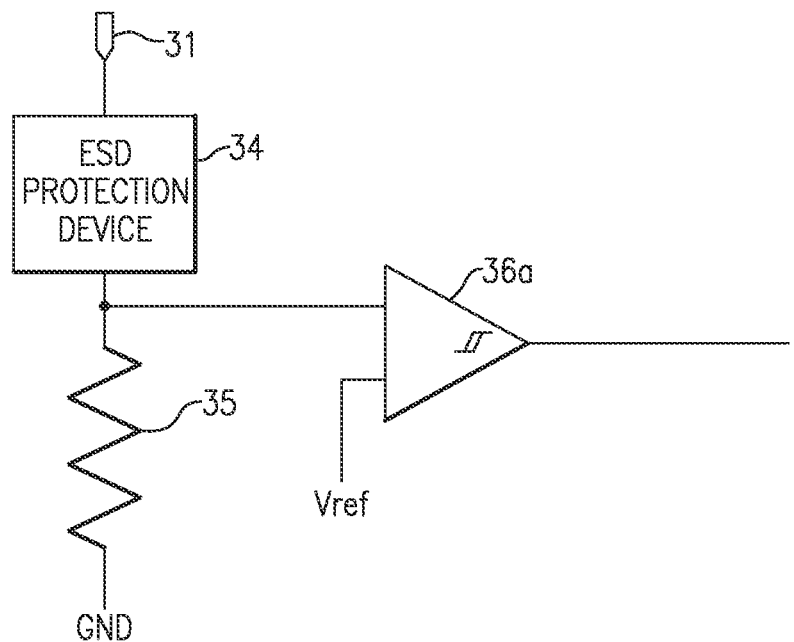
FIG. 5 is a schematic diagram that includes a detection circuit and an electrical overstress protection device according to an embodiment.

FIG. 5 is a schematic diagram that includes a detection circuit 36a and an ESD protection device 34 according to an embodiment. The detection circuit 36a includes a comparator. As illustrated, the resistor 35 is disposed between the ESD protection device 34 and ground. A voltage generated across the resistor 35 can be compared to a reference voltage $V_{REF}$. The resistance of the resistor 35 and the reference voltage can be selected such that ESD events above a threshold level trigger the comparator to indicate that an ESD event has occurred. The resistance of the resistor 35 can be selected such that the voltage across the resistor 35 provided to the comparator is at a voltage level that is unlikely to damage the comparator. The comparator can be implemented by any suitable circuitry configured to detect when the voltage across the resistor 35 exceeds a threshold that indicates that an ESD event has occurred.

Figure 6:
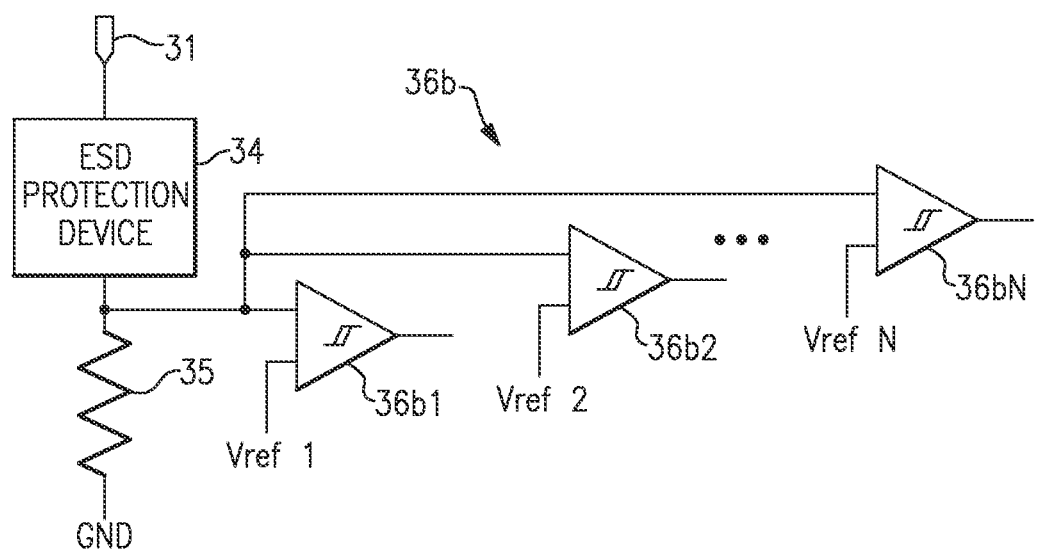
FIG. 6 is a schematic diagram that includes a detection circuit and an electrical overstress protection device according to another embodiment.

FIG. 6 is a schematic diagram that includes a detection circuit 36b and an ESD protection device 34 according to another embodiment. The detection circuit 36b includes a plurality of comparators 36b1, 36b2, and 36bN that are each configured to compare the voltage across the resistor 35 to a different reference voltage ($V_{REF1}$, $V_{REF2}$, and $V_{REFN}$, respectively). Any suitable number of comparators can be implemented. Using the plurality of comparators 36b1, 36b2, and 36bN, an intensity or level of an ESD event can be detected. The level of the ESD event can correspond to the magnitude of the highest reference voltage provided to a comparator of the plurality of comparators that detects an occurrence of an ESD event. As such, the detection circuit 36b can detect an occurrence of an ESD event and an intensity of the ESD event.

Figure 7:
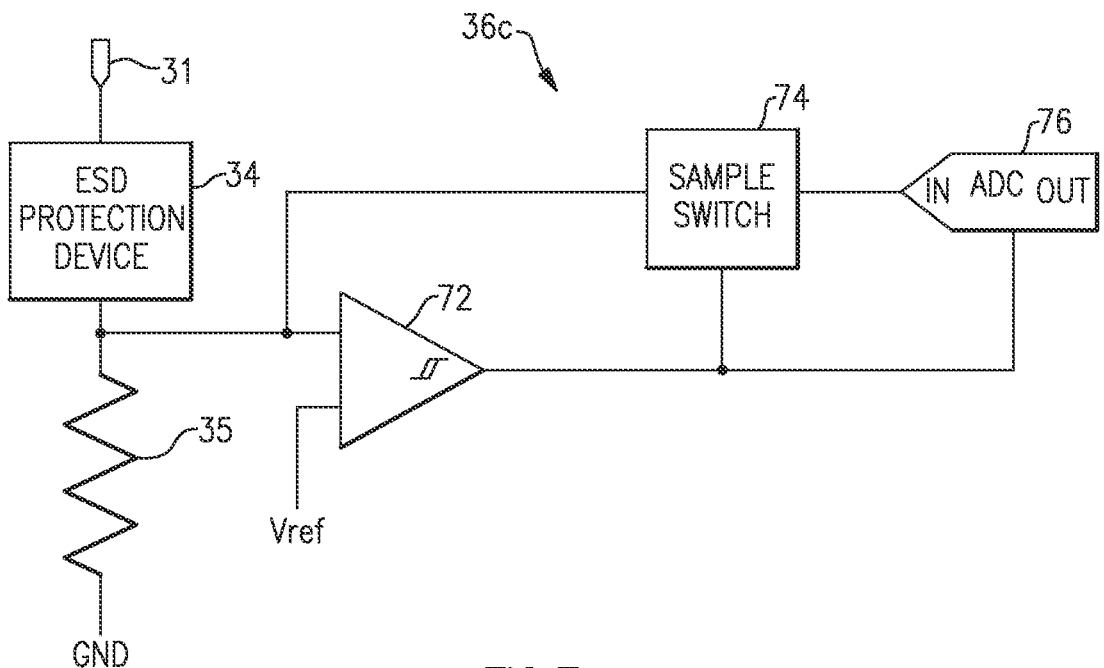
FIG. 7 is a schematic diagram that includes a detection circuit and an electrical overstress protection device according to another embodiment.

FIG. 7 is a schematic diagram that includes a detection circuit 36c and an ESD protection device 34 according to another embodiment. As illustrated, the detection circuit 36c includes a comparator 72, a sample switch 74, and an analog-to-digital converter (ADC) 76. The ADC 76 can be used to determine a level of an ESD event. Like the detector circuit 36a of FIG. 5, the comparator 72 can detect an occurrence of an ESD event. Responsive to detecting an occurrence of an ESD event above a level determined by the resistance of resistor 35 and the voltage level of the reference voltage $V_{REF}$, the output of the comparator 72 is toggled. This can cause the sample switch 74 to sample the voltage across the resistor 35. The sampled voltage can be converted to a digital voltage level by the ADC 76. The output of the ADC 76 can be indicative of a level of the ESD event. As such, the detection circuit 36c can provide information associated with a detected ESD event, which can indicate an occurrence of the ESD event and a level associated with the ESD event.

Figure 8:
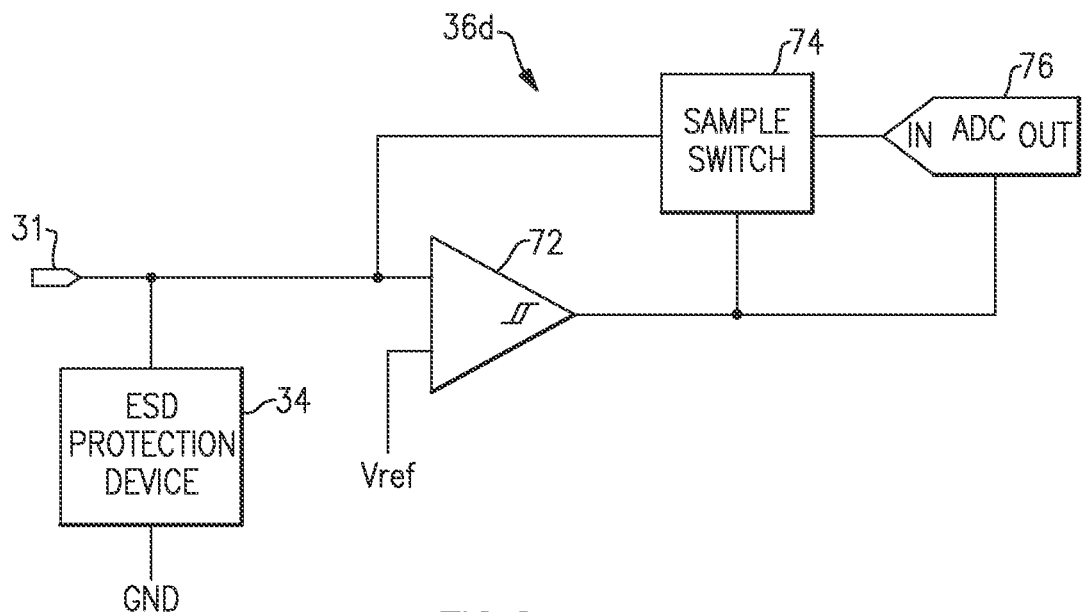
FIG. 8 is a schematic diagram that includes a detection circuit and an electrical overstress protection device according to another embodiment.

FIG. 8 is a schematic diagram that includes a detection circuit 36d and an ESD protection device 34 according to another embodiment. The detection circuit 36d is similar to the detection circuit 36c except a voltage across the ESD protection device 34 is used to trigger the comparator 72 and to detect a level of the ESD event. When the ESD protection device 34 is triggered, it can go into snapback mode and hold at a holding voltage with a resistance. The holding voltage can be used to detect an occurrence of an ESD event and the level of the ESD event. The ESD protection device 34 can be characterized and then characterization data can be used to determine the level of the ESD event.

Various memories can store information indicative of an electrical overstress event detected by the detection circuits discussed herein. Such memories can include non-volatile memories and/or volatile memories.

Figure 9:
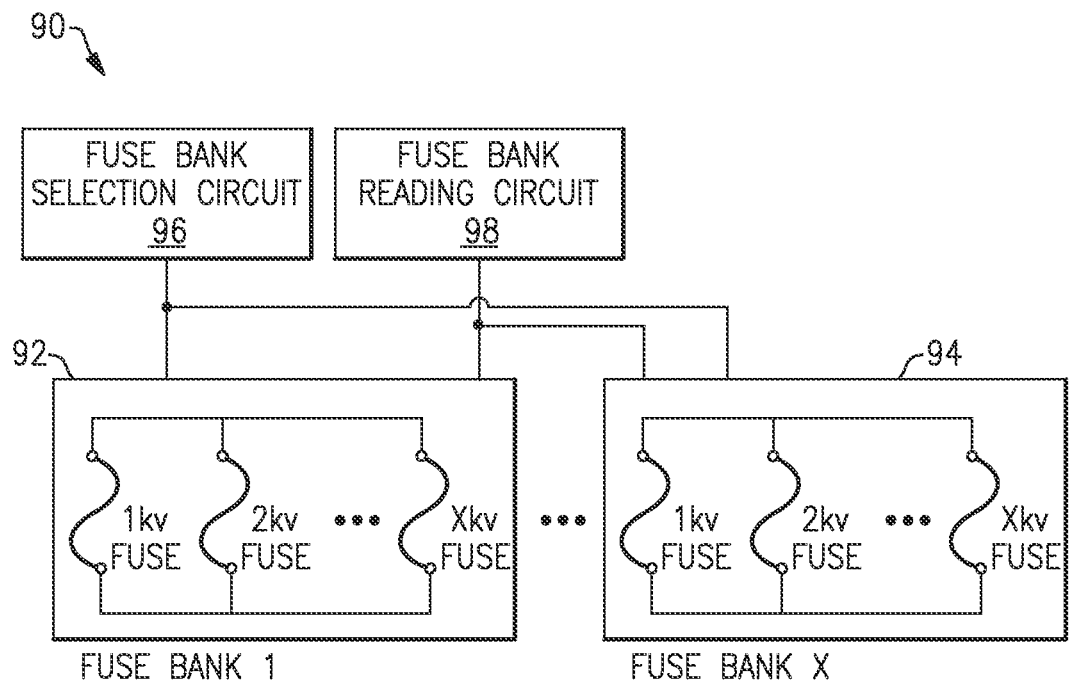
FIG. 9 is a schematic diagram of an illustrative circuit that is configured to detect and store information associated with electrical overstress events according to an embodiment.

In certain embodiments, detecting an EOS can be implemented by memory elements configured to store data under certain conditions. FIG. 9 is a schematic diagram of illustrative detection and memory circuit 90 that is configured to detect and store information associated with an ESD event according to an embodiment. The detection and memory circuit 90 can implement the functionality of the detection circuit 16 and the memory 17 of FIG. 1B.

The detection and memory circuit 90 includes fuses. Fuses are one type of non-volatile memory that can store data and/or alter the functionality of a device post manufacture. The detection and memory circuit 90 includes fuse banks 92 and 94, a fuse bank selection circuit 96, and a fuse bank reading circuit 98. The fuses of one or more of the fuse banks can be configured to blow at predetermined ESD event levels. Different fuses of a selected fuse bank can blow at different ESD event levels. The fuse bank reading circuit 98 can read from one or more of the fuse banks 92 and 94 to determine whether an ESD event has occurred and a level associated with the ESD event. For instance, if any of the fuses are blown, the occurrence of an ESD event can be detected. The level associated with the ESD event can be detected based on which fuse(s) are blown. The detection and memory circuit 90 can operate even when an electronic device is not powered. The fuses can be one-time programmable such that once a fuse in a fuse bank is blown, the fuse bank selection circuit 96 can select a different fuse bank to detect an ESD event. The detection and memory circuit 90 can detect ESD events of both a positive and a negative polarity. While FIG. 9 was described with reference to fuses for illustrative purposes, the principles and advantages discussed with this figure can be applied to other fuse elements, such as anti-fuses, and/or to other memory elements that can be selectively activated by different voltages.

Figure 10:
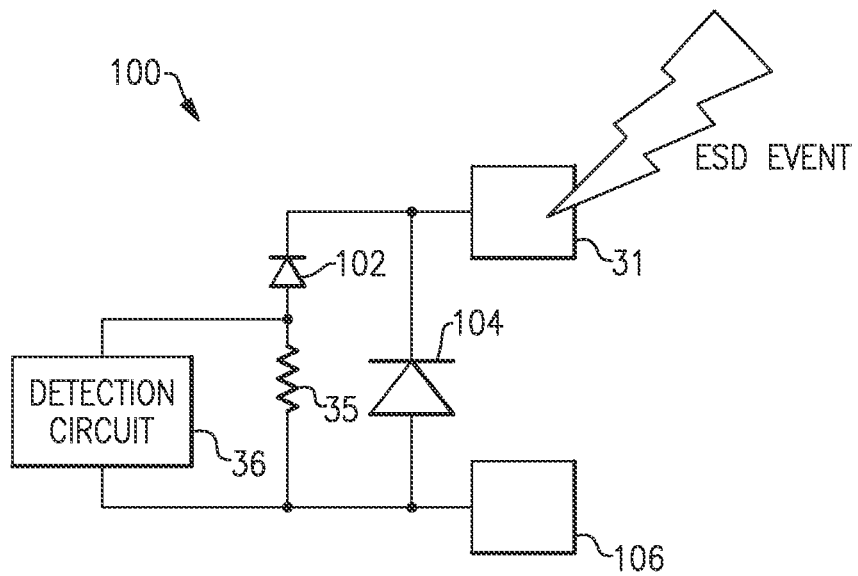
FIG. 10 is a schematic diagram of a portion of an electronic device with an electrical overstress event detection circuit according to an embodiment.

EOS event detection can detect non catastrophic EOS events that age a device without completely damaging the device. Such functionality can monitor a circuit with slightly lower breakdown than other circuits and provide aging information about the circuit. FIG. 10 is a schematic diagram of a portion of an electronic device 100 with an ESD event detection circuit 36 according to an embodiment. The electronic device includes a first ESD protection device 102 and second ESD protection device 104.

The first ESD protection device 102 can be a diode having a relatively low breakdown voltage and a relatively small physical area and the second ESD protection device 104 can be a diode having a relatively high breakdown voltage and a relatively large physical area. These ESD protection devices are illustrated as diodes, but other suitable ESD protection devices can alternatively be implemented. The first ESD protection device 102 can trigger at a lower voltage than the second ESD protection device 104. In an illustrative example, the first protection device 102 can trigger at about 6.5 Volts and the second ESD protection device 104 can trigger at about 7 Volts. The second ESD protection device 104 can handle more current than the first ESD protection device 102. A resistor 35 can be in series with the first ESD protection device 102, for example, to prevent thermal runaway and/or to provide a voltage for the detection circuit 36.

With the first ESD protection device 102, ESD events below the threshold for triggering the second ESD protection device 104 can be detected and associated data can be used to determine the age/state of "health" of a part. The ESD protection offered by the first ESD protection device 102 may not be sufficient to protect an internal circuit, but the ESD protection offered by the first ESD protection device 102 can provide a way to monitor what is happening in the second ESD protection device 104 without including a resistance, which should diminish the effectiveness of the second ESD protection device 104, in series with the second ESD protection device 104.

The detection circuit 36 can detect an ESD event using the voltage across the resistor 35. The detection circuit 36 can blow a fuse and/or load another memory each time an ESD event is detected. After a certain number of ESD events (e.g., 10 events) are detected, an alarm signal can be provided. For instance, the alarm signal can be toggled when all fuses can be blown and/or memory cells can overflow. The alarm signal can provide an alert to warn that a device has been aged by ESD events.

EOS detection circuitry can provide functional safety information at the die level and/or at a system level. At the die level, recording and monitoring EOS events can provide an indication of the functional safety of the die. Such information can be reported external to the die. An alarm signal can be provided external to the die to provide a warning about the functional safety of the die and/or to suggest that action be taken, such as replacement of the die. At the system level, detecting EOS events can provide information about functional safety at a system level. Such information can be used for predictive maintenance, for example.

Functional safety circuitry associated with detecting EOS events can be incorporated within a die and/or at a system level. For some expensive and/or custom integrated circuit systems where reliability and/or quality is paramount, having the capability of sensing EOS events (e.g., current surges and/or voltage surges applied from external to the system) and being able to provide information associated with the detected EOS events can be advantageous. Such information can be provided external to the integrated circuit system and/or can set an alarm within the integrated circuit system to indicate that there is a functional safety issue. Functional safety circuitry can be implemented in a variety of contexts including stacked die and/or prefabricated layers/components within a 3D vertically integrated system.

Figure 11:
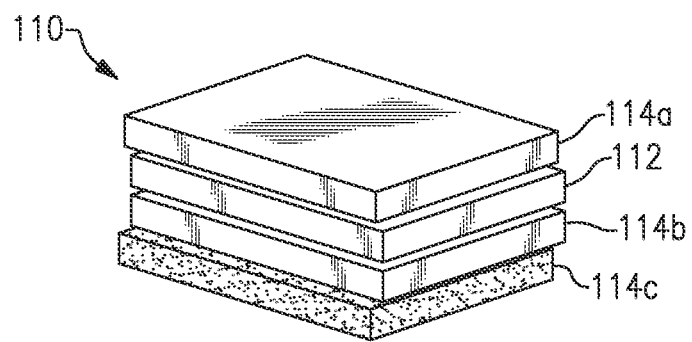
FIG. 11 is a diagram of stacked dies including a die that includes functional safety circuitry according to an embodiment.

FIG. 11 is a diagram of stacked die 110 including a die 112 that includes functional safety circuitry according to an embodiment. The stacked die 110 can include the die 112 stacked with one or more other die 114a, 114b, 114c. The functional safety circuitry can implement any combination of features discussed herein associated with detecting an EOS event, storing information associated with the EOS event, reporting the EOS event, providing EOS and/or ESD protection, the like, or any combination thereof. For instance, the functional safety circuitry of the die 112 can detect and record an overvoltage event or another EOS event. In some instances, the functional safety circuitry can record an intensity, a duration, a frequency, or any combination thereof of the EOS event. The functional safety circuitry can transmit the recorded information external to the stacked die 110 wirelessly by way of an antenna in an embodiment.

Figure 12:
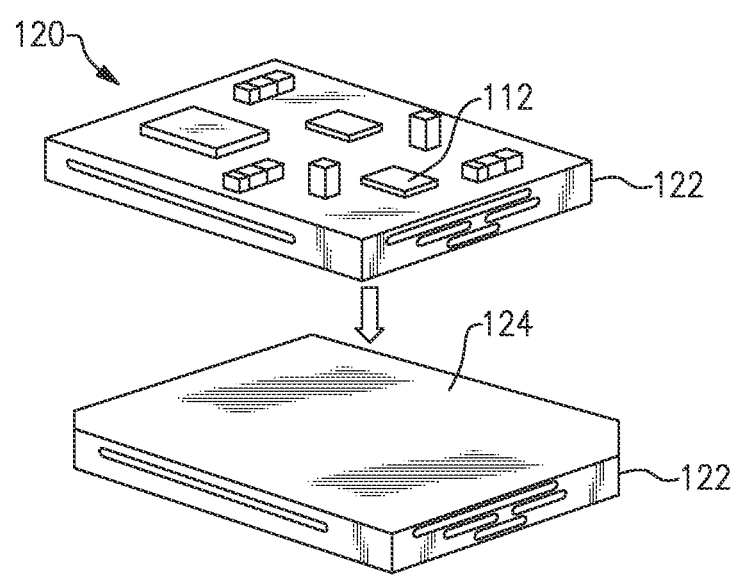
FIG. 12 is a diagram of a system in a package that includes functional safety circuitry according to an embodiment.

FIG. 12 is a diagram of a system in a package 120 that includes functional safety circuitry according to an embodiment. A die 112 that includes functional safety circuitry can be disposed on a circuit board 122 with other components. The die 112 and the other components can be encased within a single package. The system in a package 120 can include an over mold compound 124 that encapsulates the die 112 and other components. In this embodiment, the functional safety circuitry can provide indicators as to the effective health of the system. The indicators can be communicated externally from the system by the die 112 and/or the other components, for example, wirelessly or by being provided to an output contact of the system in a package 120.

Figure 13:
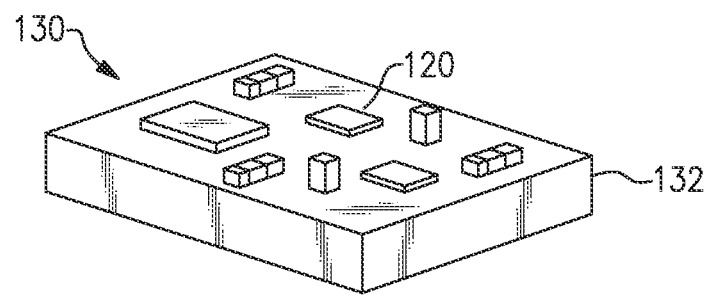
FIG. 13 is a diagram of a system that includes functional safety circuitry according to an embodiment.

FIG. 13 is a diagram of an integrated circuit system 130 that includes functional safety circuitry according to an embodiment. The integrated circuit system 130 can be arranged to provide functionality targeted to a variety of applications. For instance, the integrated circuit system 130 can be an automotive electronics system configured for automotive applications (e.g., power steering). As another example, the integrated circuit system 130 can be a vehicular electronics system, such as an avionics electronics system configured for aircraft applications. In another example, the integrated circuit system 130 can be a healthcare electronics systems configured for healthcare monitoring (e.g., monitoring a heart rate and/or monitoring another physiological parameter) and/or for other healthcare applications. The illustrated integrated circuit system 130 includes the system in a package 120 of FIG. 12 and other components on a system board 132. The functional safety circuitry of the system in a package 120 can provide information indicative of potential failures with protection devices of the integrated circuit system 130 that are external to the system in a package 120. For example, a faulty diode of the integrated circuit system 130 might fail to prevent certain undesired static currents and/or current surges. The functional safety circuitry of the system in a package 120 can monitor and record such EOS events. The functional safety circuitry can provide an external warning of such an issue. The functional safety circuitry can provide an indication of a life span of the integrated circuit system 130.

Harvesting Energy from Electrical Overstress Events

As discussed above, aspects of this disclosure relate to harvesting energy associated with electrical overstress events, such as ESD events. The energy harvesting discussed herein can be implemented in a variety of contexts. For instance, energy harvesting can be implemented at a die or chip level. This can result in a reduction of power consumption at the die level, which can in turn reduce power consumption in a larger system. As another example, energy harvesting can be implemented at a system level, in a vertically integrated system of stacked die, or in an industrial application. A system in a package that includes energy harvesting circuitry/structures can be included in a larger system. As yet another example, energy harvesting can be implemented in a system with moving parts, such as rotating shafts, arranged to enhance harvesting of charge associated with generated static charges/EOS events.

Energy from EOS events can be stored by storage elements, such as capacitor(s), and the charge can be provided to the system. Accordingly, energy associated with potentially damaging EOS events can be used to power circuits. Storage elements can be activated and/or deactivated as desired. Circuitry can selectively enable and/or initiate storage element activity. For example, portions of storage elements can be discharged while other portions of storage elements can be charged.

The principles and advantages discussed in connection with harvesting energy associated with EOS events can be implemented in connection with any of the principles and advantages discussed with reference to detecting and recording and/or reporting EOS events. Illustrative embodiments related to harvesting energy from EOS events will now be discussed.

An apparatus can include an EOS steering device and a storage element configured to store charge associated with an EOS event, in which the EOS steering device can provide energy associated with an EOS event to the storage element. The EOS device can be disposed between a pin of an electronic device and the storage element. The storage element can include, for example, a capacitor. The EOS steering device can be ESD steering device and EOS event can be an ESD event. A detection circuit can be provided in combination with the storage element. The detection circuit can detect an EOS event.

Figure 14:
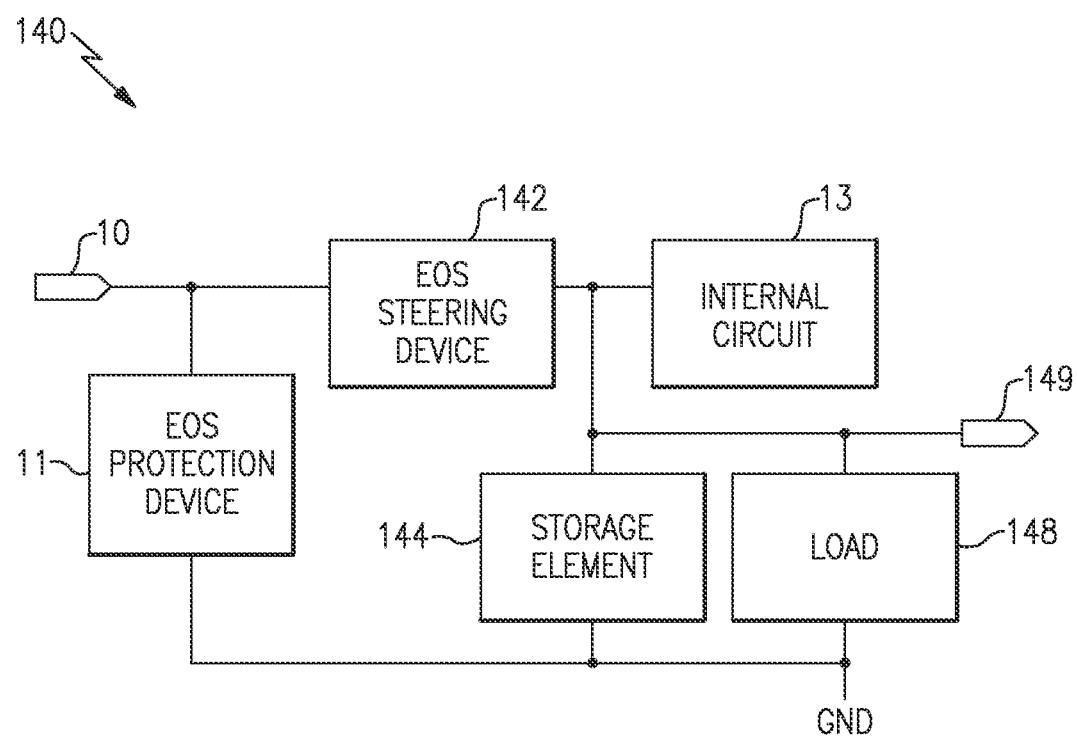
FIG. 14 is a schematic diagram of an illustrative electronic device that is configured to store charge associated with an electrical overstress event according to an embodiment.

FIG. 14 is a schematic diagram of an illustrative electronic device 140 that is configured to store charge associated with an electrical overstress event according to an embodiment. As illustrated, the electronic device 140 includes an input contact 10, an EOS protection device 11, an EOS steering device 142, an internal circuit 13, a storage element 144, a load 148, and an output contact 149. The illustrated elements of the electronic device 140 can be included within a single package. The electronic device 140 can include more elements than illustrated and/or a subset of the illustrated elements. The electronic device 140 can be a die, for example. As such, in some instances, the illustrated elements of the electronic device 140 can be embodied on a single die.

The electronic device 140 is configured to receive an input signal at the input contact 10, which can be an input pin as illustrated. The EOS protection device 11 is configured to provide protection from electrical overstress events. The illustrated EOS protection device 11 is configured to protect the circuitry electrically connected to the input contact 10 by diverting current associated with an EOS event to ground when a signal on the input contact 10 exceeds an EOS capability of the devices being protected, e.g., voltage breakdown. The EOS protection device 11 can protect the internal circuit 13 and the storage element 142 from electrical overstress events. In FIG. 14, the EOS protection device 11 is disposed between the input contact 10 and ground. The EOS protection device 11 can be disposed between the input contact 10 and any other suitable low voltage reference. The EOS protection device 11 can be an ESD protection device configured to provide ESD protection, for example.

The EOS steering device 142 can direct energy associated with an ESD event to the storage element 144 and to prevent charged stored by the storage element 144 from escaping. The EOS steering device can be implemented by any suitable ESD protection device, such as any of the ESD protection devices discussed with reference to FIGS. 2A to 2D. The EOS steering device 142 can be disposed between the input contact 10 and the internal circuit 13. Alternatively, an ESD isolation device can be disposed between the internal circuit 13 and the input contact 10 similar to FIG. 1B. It can be desirable to have an intervening circuit element between the internal circuit 13 and a pin from which energy associated with an EOS event is being harvested.

The storage element 144 can include one or more capacitors and/or a battery. As illustrated, the storage element 144 is in series with the EOS steering device 142. The EOS protection device 11 is in parallel with the series combination of the EOS steering device and the storage element 144. The load 148 can be in parallel with the storage element 144. In some embodiments, the voltage across the storage element 144 can be regulated for providing to other circuitry. Charge from the storage element can be provided to an output contact 149 of the electronic device 140. As such, energy harvested from an EOS event can be provided to circuitry external to the electronic device 140. Alternatively or additionally, charge energy harvested from an EOS event can be provided to other circuitry within the electronic device, such as the internal circuit 13, and/or to a battery of the electronic device.

Figure 15:
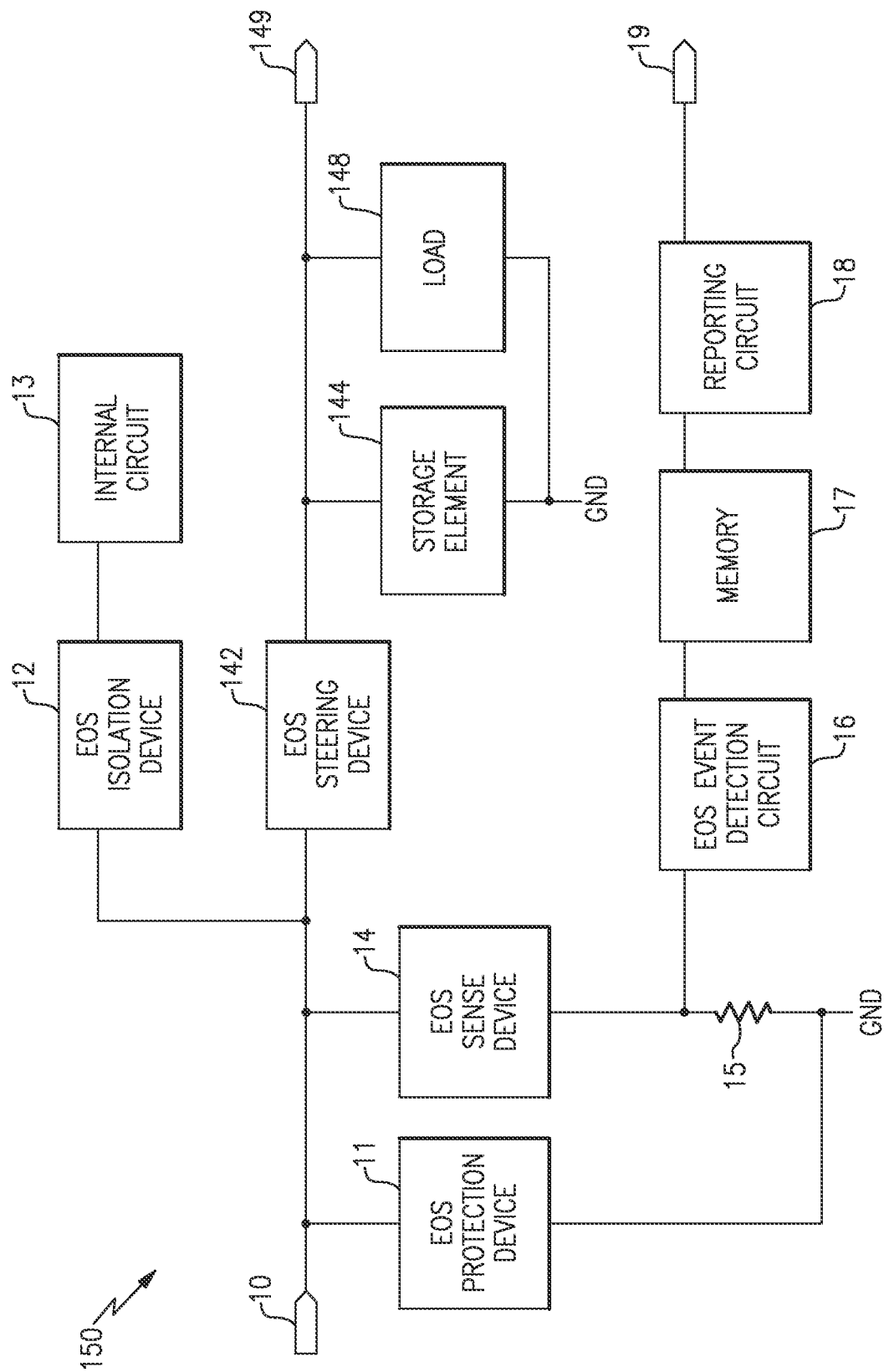
FIG. 15 is a schematic diagram of an illustrative electronic device that is configured to store charge associated with an electrical overstress event and to detect an occurrence of the electrical overstress event according to an embodiment.

FIG. 15 is a schematic diagram of an illustrative electronic device 150 that is configured to store charge associated with an electrical overstress event and to detect an occurrence of the electrical overstress event according to an embodiment. The electronic device 150 illustrates an example of how energy harvesting circuitry can be combined with detection circuitry configured to detect an EOS event. Another example in the context of ESD events is shown in FIG. 4.

Figure 16:
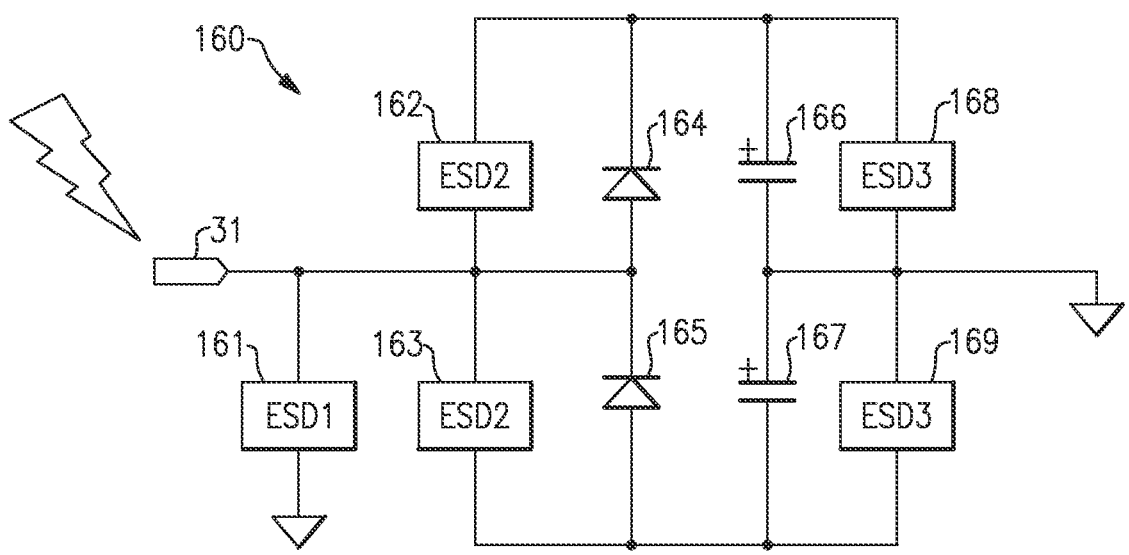
FIG. 16 is a schematic diagram of a portion of an illustrative electronic device configured to store charge associated with an electrical overstress event according to an embodiment.

FIG. 16 is a schematic diagram of a portion of an illustrative electronic device 160 configured to store charge associated with an electrostatic discharge event according to an embodiment. The electronic device 160 provides bipolar performance of energy harvesting of ESD events. As shown in FIG. 16, an ESD event can occur at pin 31. The ESD protection device 161 can provide clamping for ESD events that exceed the capacity of the system. ESD protection devices 162 and 163 provide are arranged in parallel with diodes 164 and 165, respectively, in FIG. 16. The ESD protection devices 162 and 163 can provide ESD protection for diodes 164 and 165, respectively. In particular, these ESD protection devices can each protect a respective diode from reverse breakdown. The diodes 164 and 165 are examples of the EOS steering device 142 of FIGS. 14 and/or 15. The first diode 164 can steer current to charge a first capacitor 166. The second diode 165 can steer current of an opposite polarity to charge a second capacitor 167. Accordingly, charge associated with both positive and negative ESD events can be stored in a storage element that includes the capacitor 166 and 167. ESD protection devices 168 and 169 can provide ESD protection for capacitors 166 and 167, respectively.

Figure 17:
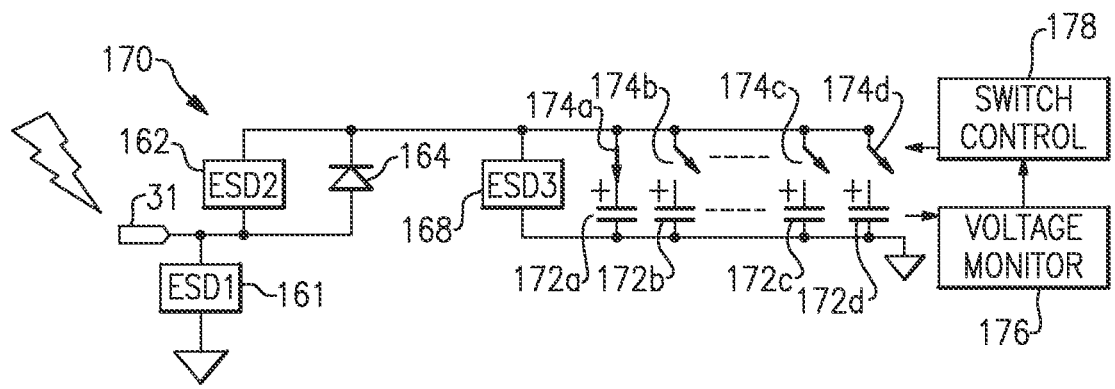
FIG. 17 is a schematic diagram of a portion of an illustrative electronic device configured to store charge associated with an electrical overstress event in a bank of storage elements according to an embodiment.

FIG. 17 is a schematic diagram of a portion of an illustrative electronic device 170 configured to store charge associated with an electrostatic discharge event in a bank of storage elements according to an embodiment. Multiple ESD events can occur. Such ESD events can have different magnitudes. Having a bank of storage elements can enable charge associated with different ESD events to be efficiently stored. A plurality of switches 174a to 174d can each be arranged in series with a respective capacitor 172a to 172d. In an embodiment, a selected one of the switches 174a to 174d can be on at a time. This can selectively electrically connect a selected capacitor to the diode 164. Energy associated with an ESD event at the pin 31 can be steered by the diode 164 to capacitor of the plurality of capacitors 172a to 172d that is electrically connected to the diode 164 by way of a switch. A voltage monitoring circuit 176 can monitor the charge stored by each of the capacitors 172a to 172d. The voltage monitoring circuit can detect which capacitor stores the least charge. A switch control circuit 178 can turn on a selected switch based on information from the voltage monitoring circuit 176. Having the capacitor storing the least charge configured to capture charge associated with an ESD event can be an efficient way of capturing charge and can enable energy harvesting of as many relatively small ESD pulses as possible.

Various circuits can store energy associated with an EOS event. Illustrative circuits configured to store charge associated with EOS events will be described with reference to FIGS. 18 to 22. These circuits provide examples of circuits that can harvest energy associated with EOS events in connection with any of the principles and advantages discussed herein. Moreover, features of the any of the example energy harvesting circuits can be implemented in combination with one or more other example energy harvesting circuits.

Figure 18:
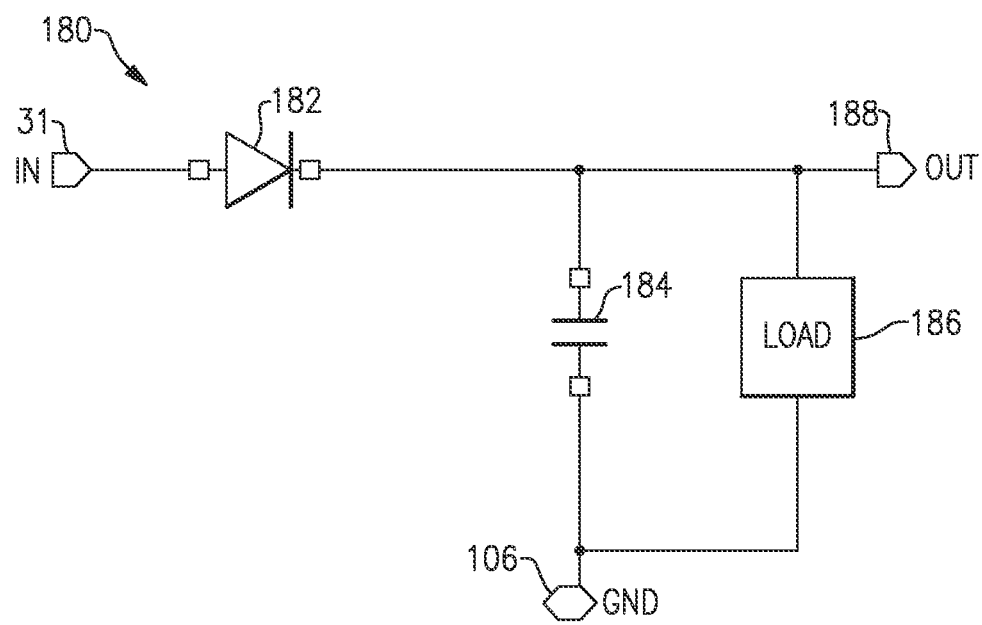
FIG. 18 is a schematic diagram of a circuit configured to store charge associated with an electrical overstress event according to an embodiment.

FIG. 18 is a schematic diagram of a circuit 180 configured to store charge associated with an electrostatic discharge event according to an embodiment. As illustrated, the circuit 180 includes an input pin 31, a diode 182, a capacitor 184, a load 186, an output pin 188, and a ground pin 106. The diode 182 is an example of an EOS steering device 142 of FIG. 14. The capacitor 184 is an example of a storage element 144 of FIG. 14. When an ESD event occurs at the pin 31 and the ESD event has a positive polarity with respect to ground pin 106, the diode 182 can be forward biased and the capacitor 184 can be charged to a voltage. The voltage across the capacitor 184 can be approximately equal to the available charge divided by the capacitance of the capacitor 184. Once the voltage at the pin 31 drops below the voltage across the capacitor 184, the charging phase can stop. The diode 182 can become reverse biased and the capacitor 184 can remain in a charged state. In the configuration illustrated in FIG. 18, the capacitor 184 can have a breakdown voltage in excess of a maximum expected voltage associated with an ESD event. The load 186 can be a resistive load, for example. The charge across capacitor 184 can be provided to other circuitry by way of output pin 188.

Figure 19:
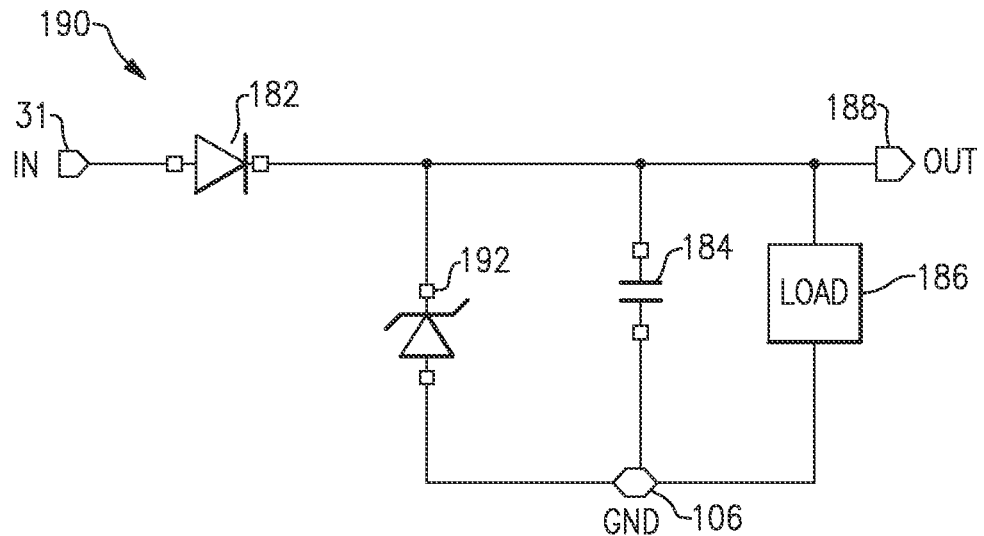
FIG. 19 is a schematic diagram of a circuit configured to store charge associated with an electrical overstress event according to another embodiment.

FIG. 19 is a schematic diagram of a circuit 190 configured to store charge associated with an electrostatic discharge event according to another embodiment. The circuit 190 provides clamping and voltage regulation. The circuit 190 is like the circuit 180 of FIG. 18 except that an ESD protection device 192 is included. The ESD protection device 192 can be arranged in parallel with the capacitor 184. The ESD protection device 192 can function as an ESD clamp and/or protection device. The ESD protection device 192 can ensure that the voltage on a plate of the capacitor 184 opposite ground is clamped to a voltage below the breakdown of the capacitor 184. The ESD protection device 192 can function is as a voltage regulator. When an ESD event is over, the ESD protection device 192 can shut current to ground GND until the voltage across the capacitor 184 is at approximately the breakdown voltage of the ESD protection device 192. In a specific example, if the ESD protection device 192 has a breakdown voltage of 5 Volts, once the ESD event is over the ESD protection device 192 can shunt current to ground GND until the voltage across the capacitor 184 is approximately 5 Volts. Accordingly, the voltage stored on the capacitor 184 can be regulated to a voltage safe to be used by downstream circuits. The ESD protection device 192 can be a Zener diode as illustrated.

Figure 20:
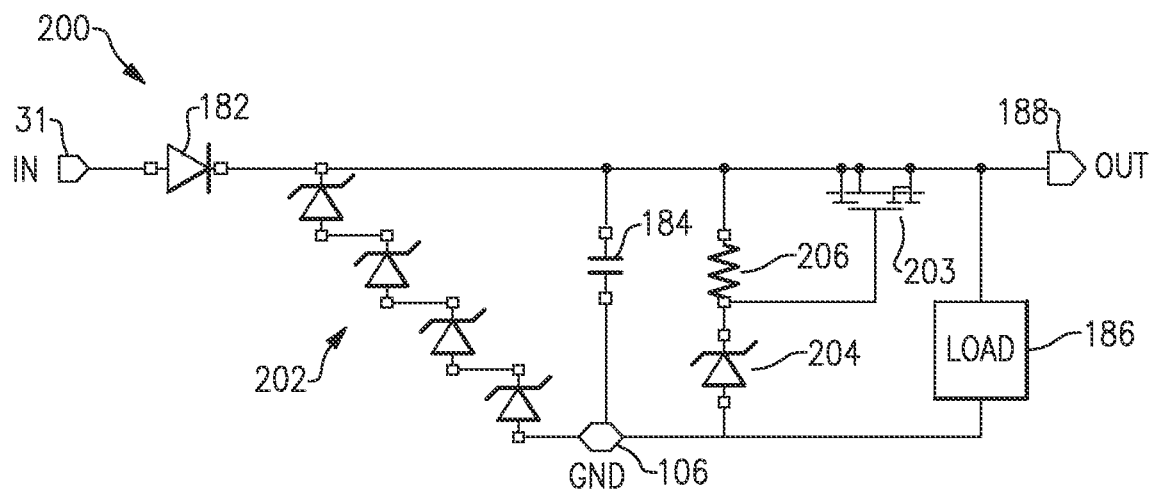
FIG. 20 is a schematic diagram of a circuit configured to store charge associated with an electrical overstress event according to another embodiment.

FIG. 20 is a schematic diagram of a circuit 200 configured to store charge associated with an electrostatic discharge event according to another embodiment. The circuit 200 provides clamping and voltage regulation. In FIG. 20, the ESD protection device 192 of FIG. 19 is replaced by an ESD clamp circuit 202. As illustrated, the ESD clamp cell 202 can be a stack of Zener diodes. As one example, the stack of Zener diodes can clamp the voltage across the capacitor 184 to approximately 20 Volts. The ESD clamp circuit 202 can be implemented by any suitable ESD clamp circuit such as NPN ESD device, an SCR, etc. A separate voltage regulator can be implemented, for example, by transistor 203, diode 204, and resistor 206. Any other suitable voltage regulator can alternatively be implemented. Moreover, such a voltage regulator can provide any suitable regulated voltage for a particular application.

Figure 21:
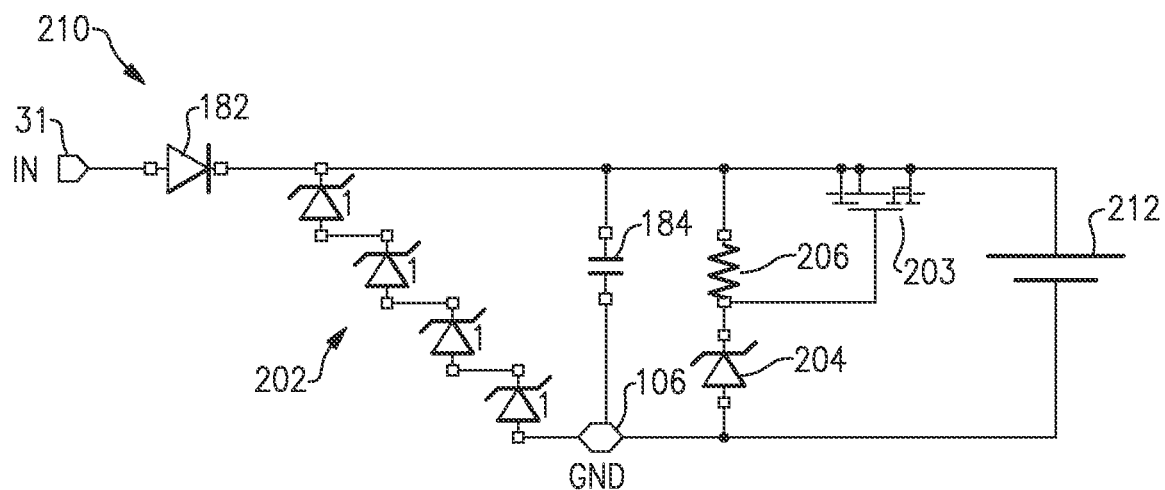
FIG. 21 is a schematic diagram of a circuit configured to store charge associated with an electrical overstress event according to another embodiment.

FIG. 21 is a schematic diagram of a circuit 210 configured to store charge associated with an electrostatic discharge event according to another embodiment. FIG. 21 illustrates that the charge stored in connection with an ESD event can be provided to a battery 212 to recharge the battery 212. Accordingly, energy harvested from an ESD event can be stored on a storage element, voltage can be regulated, and the battery 212 can be recharged using energy harvested from the ESD event.

Figure 22:
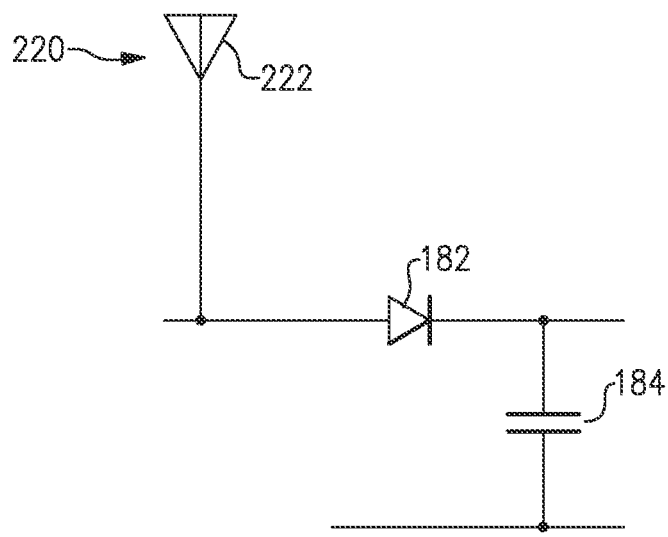
FIG. 22 is a schematic diagram of a circuit configured to store charge associated with an electrical overstress event according to another embodiment.

FIG. 22 is a schematic diagram of a circuit 220 configured to store charge associated with an electrostatic discharge event according to another embodiment. An EOS energy harvester can work in a similar way to how a radio receiver works. As shown in FIG. 22, a basic diode detector used for AM radio can implement diode 182. The diode 182 can receive a signal from the antenna 222 and the capacitor 184 can store charge associated with an EOS event. The diode 182 can be a crystal diode as illustrated in FIG. 22. Features of FIG. 22 can be combined with a voltage regulator and the energy stored by the capacitor 184 can be provided to other circuits and/or a battery, for example, as described above. Moreover, the features of FIG. 22 can be combined with a detection circuit configured to detect that an EOS event has occurred. Such a detection circuit can be implemented in accordance with the principles and advantages of the detection circuits discussed herein.

Energy harvesting circuits as discussed herein can be implemented in a variety of electronic systems. For example, such circuits can be implemented in vertically integrated systems. The energy harvesting circuitry can be implemented on a dedicated die or layer of a vertically integrated system, such as the die 112 in FIG. 11. Energy harvesting circuitry can be implemented at least partly on a layer in a vertically integrated system that includes prefabricated circuit elements, such as passives. Energy harvesting circuitry can be implemented at an integrated circuit level, at a system in a package level, at larger system level, or any combination thereof. When energy harvesting circuitry is implemented at a system level, die area may not be a limiting factor. Accordingly, relatively large EOS protection devices can provide higher than typical current density capabilities. Alternatively or additionally, relatively less complicated devices can be implemented at a system level, such as larger reverse biased diodes. Moreover, relatively high EOS protection can be provided at a system level and a higher level of charge may be captured than at a die level in certain applications.

Certain physical layouts of ESD protection devices can be implemented for high performance. The physical layouts discussed below can be implemented in connection with any of the EOS protection devices discussed herein. Example physical layouts are illustrated in FIGS. 23A to 23C.

Figure 23A:
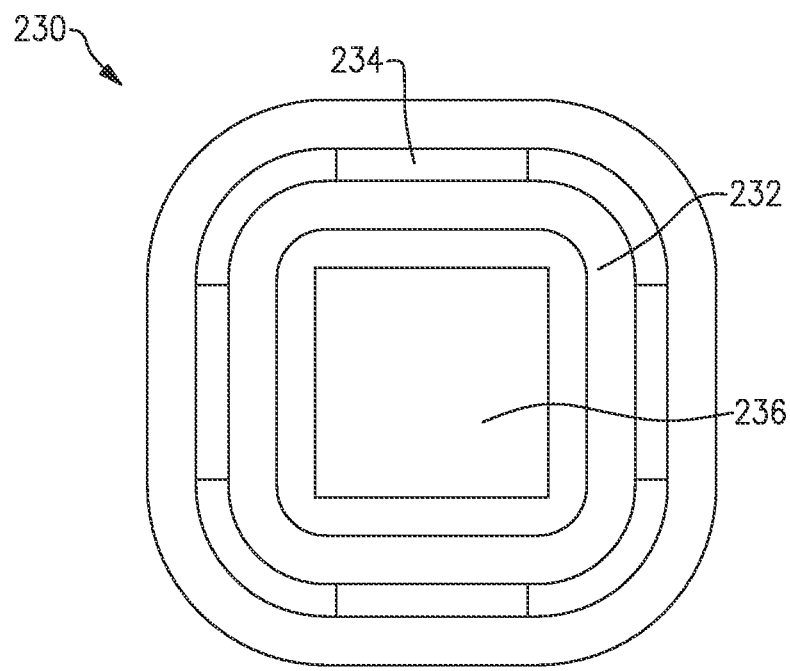
FIG. 23A is a plan view of an example layout of an electrical overstress protection device according to an embodiment.
Figure 23B:
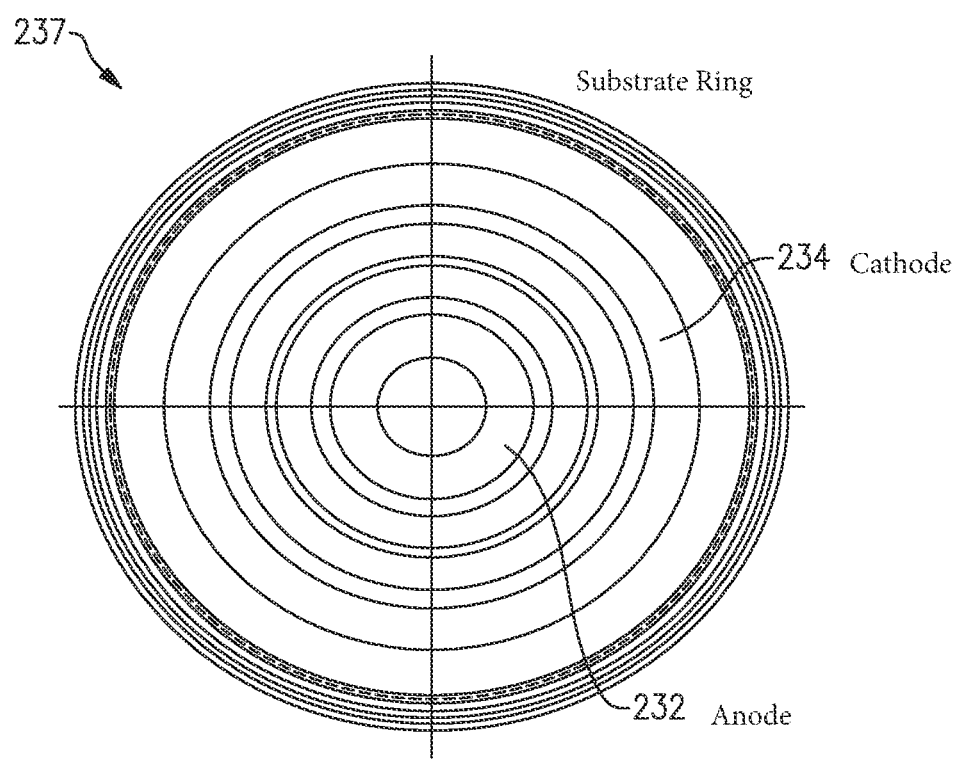
FIG. 23B is a plan view of another example layout of an electrical overstress protection device according to an embodiment.
Figure 23C:
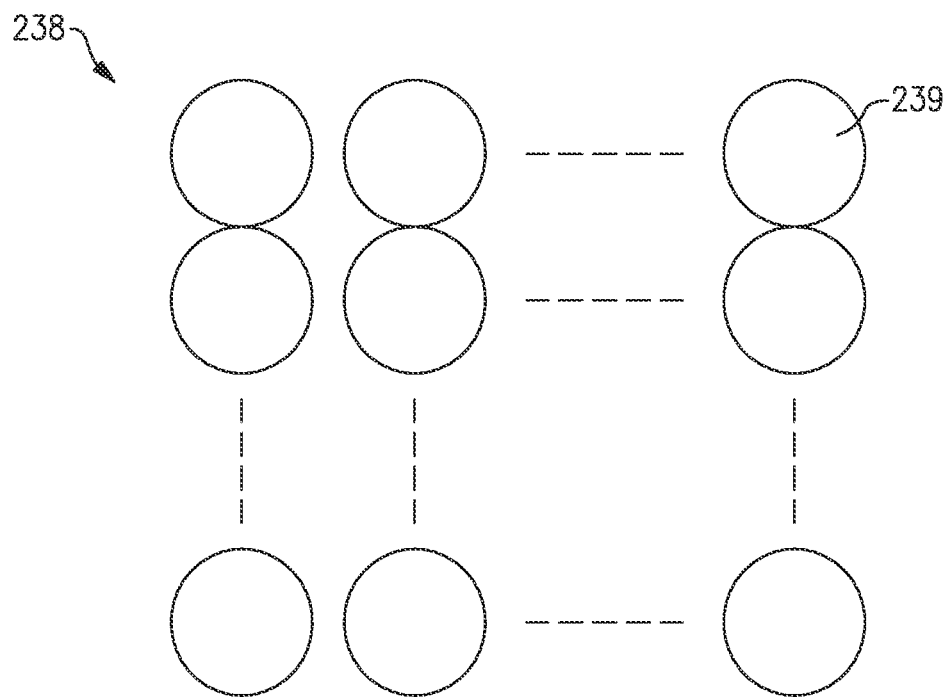
FIG. 23C is a plan view of another example layout of an electrical overstress protection device according to an embodiment.

FIG. 23A provides an example of a physical layout of an ESD protection device 230. In FIG. 23A, the ESD protection device is an annular structure in plan view. This can enable relatively high current handling capability. Anode 232 and cathode 234 of the ESD protection device 230 can be provided around a bond pad 236. The weakest point of an ESD protection device can be at the end of a finger, even with increased spacings, resistances and/or curvature, as this is the location of that typically has the highest electric field. An annular ESD silicon controlled rectifier (SCR) can be used for system level ESD protection to mimic a circular device enclosing a bond pad. Such a SCR can include any combination of features described in U.S. Pat. No. 6,236,087, the entire technical disclosure of which is hereby incorporated by reference herein.

An annularly shaped ESD protection device in plan view can have a relatively large perimeter area and hence a relatively large cross sectional area through which the current can flow. As one example, the perimeter can be about 400 µm and the diode junction can be about 3 µm deep, thus the cross section area can be about 1200 µm². Additionally, with the annular structure, metal can come out from a bond pad on four sides. This can combine to substantially minimize the resistance to an ESD zap and hence the voltage experienced by sensitive circuitry internal in the chip can be substantially minimized. Another approach that may provide an even lower resistance path to an ESD zap is a pure vertical diode where the conduction is vertically down through the silicon. In such a diode, for a 100 µm by 100 µm pad, the cross section area is 10,000 µm² and the metal resistance can also be relatively small as there can be a thick low resistance metal paddle on one side and a low resistance bond wire in close proximity on the other side.

In some instances, an ideal ESD device can be circular, as substantially the same electric field can be present along the entire a junction in such a structure. Circular ESD device layouts may not be area efficient and/or an inner anode can be smaller in junction area than an outer cathode. Circular ESD device layouts can conduct larger currents than some other common ESD layouts that consume approximately the same area. Circular ESD device layouts can conduct relatively large currents, such as currents associated with EOS events. Accordingly, such ESD device layouts can be desirable in certain applications in which an ESD device is used to harvest energy associated with an EOS event.

FIG. 23B provides an example of a physical layout of an ESD device 237. The physical layout of the ESD device 237 is a relatively large circular shape in plan view. This can reduce the difference between junction area between the anode 232 and the cathode 234.

FIG. 23C provides an example of a physical layout of an ESD device 238. The ESD device 238 is implemented by a relatively dense array of smaller circular ESD devices 239. The smaller circular ESD devices 239 can be butted against each other laterally and/or vertically. An array of smaller circular ESD devices 239 can be implemented in wearable computing devices such as smart watches, for example.

Figure 24:
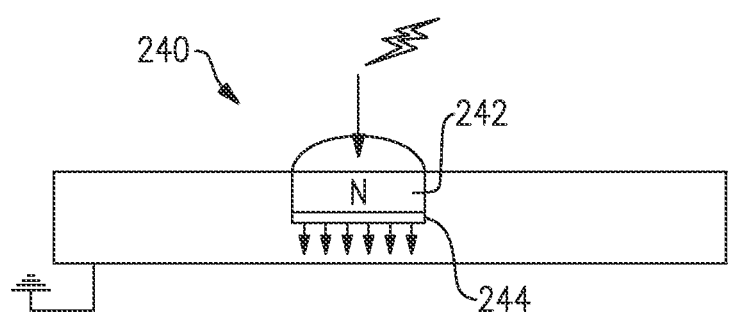
FIG. 24 illustrates another electrical overstress protection device where the current surge is conducted vertically through to the layer below according to an embodiment.

FIG. 24 illustrates another ESD protection device 240 where the current surge is conducted vertically through to the layer below. In the ESD protection device 240, current can be dissipated to ground through surface 244 below N region 242. Considering the N region 242 as a half cylinder, the ESD protection device 240 can be capable of carrying a larger current compared to an annular ESD protection structure, as the ESD protection device 240 has a larger area 244 than a corresponding annularly shaped ESD protection device. These principles can be applied when optimizing the current carrying capabilities of the structures harnessing the ESD zaps/current surges.

The illustrative energy harvesting circuits of FIGS. 14 to 22 can be embodied in a variety of integrated circuit systems. Examples of such integrated circuit systems will be discussed with reference to FIGS. 25 to 30B.

Figure 25:
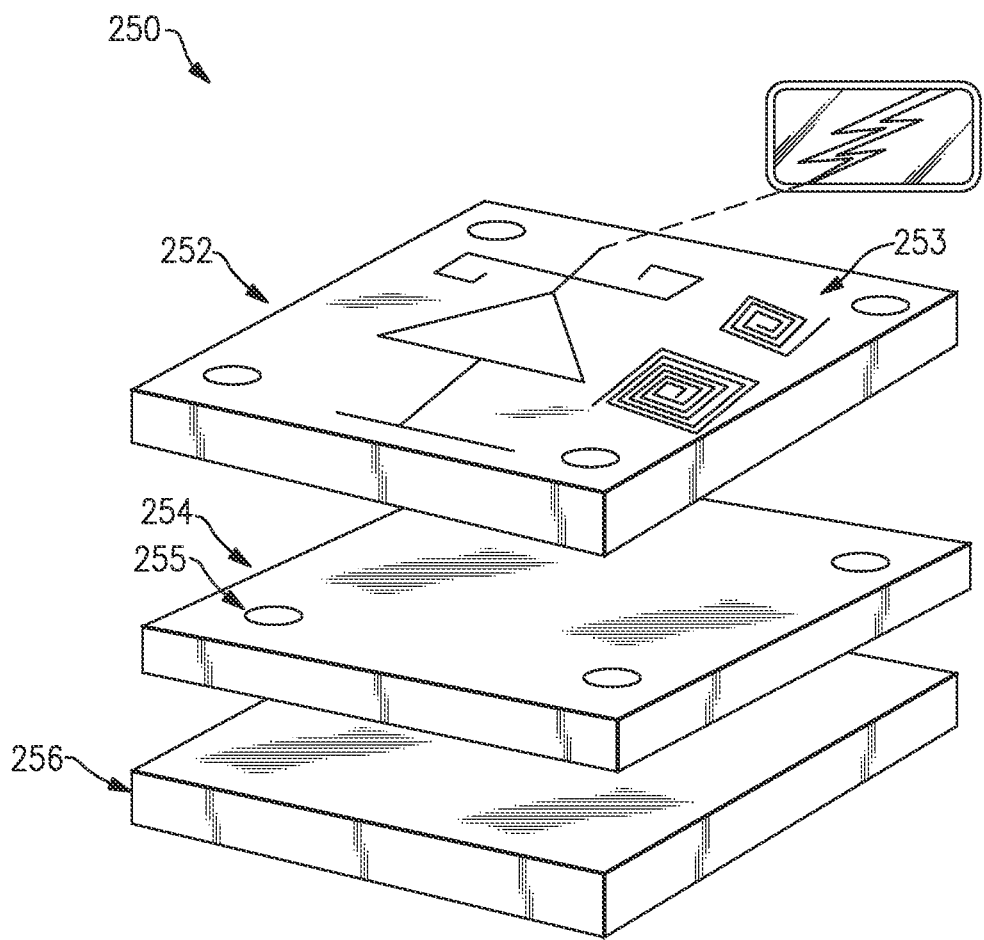
FIG. 25 illustrates an example of a vertically integrated system with scaled up structures capable of harnessing an electrical overstress event for storing charge according to an embodiment.

In some embodiments, scaled up structures capable of harnessing an EOS event for storing charge associated with the EOS event can be provided within a vertically integrated system. FIG. 25 provides an example of a vertically integrated system 250 with such functionality. The vertically integrated system 250 can include segregated and/or scaled up EOS protection devices so that it can handle larger surges and/or to link with a storage layer. The vertically integrated system 250 includes an ESD protection layer 252, an insulating layer 254, and a storage layer 256. The ESD protection layer 252 can include ESD protection devices. In some embodiments, the ESD protection layer 252 can include a detection circuit to detect an ESD event. The ESD protection layer 252 can include coils 253 or other structures that enable signals to be sent wirelessly external to the vertically integrated system 250. Alternatively or additionally, one or more other layers of the vertically integrated system 250 can include coils 253 or other structures that enable signals to wirelessly be sent external to the vertically integrated system 250. The coils or other structures can send information indicative of an ESD event and/or a warning that an external system safety protection is faulty. The insulating layer 254 can serve to insulate the ESD protection layer 252 from the storage layer 256. One or more vias 255 and/or other electrical paths can allow charge to flow from the ESD layer to the storage layer 256. The storage layer 256 can include one any of the storage elements discussed herein, such as one or more capacitors and/or other storage elements configured to store charge associated with an ESD event. Charge stored in the storage layer 256 can be provided to other circuits.

Figure 26:
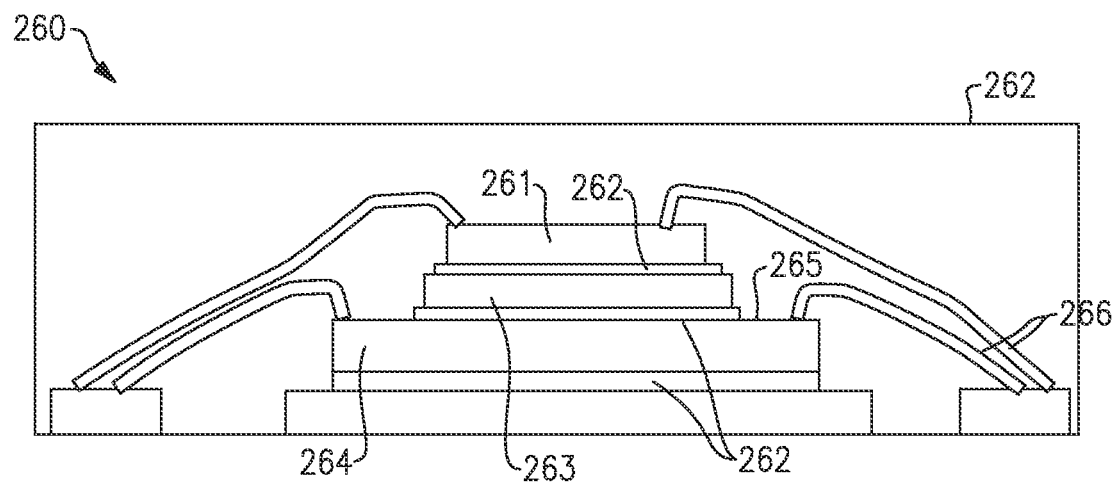
FIG. 26 is a schematic diagram of a vertically integrated system that includes electrical overstress protection and energy harvesting circuitry according to an embodiment.

FIG. 26 is a schematic diagram of a vertically integrated system 260 that includes ESD protection and energy harvesting circuitry according to an embodiment. The vertically integrated system 260 includes an ESD protection chip 261, a storage chip 263, and an application specific integrated circuit (ASIC) 264 having an active side 265. Wire bonds 266 can provide electrical connections to the ESD protection chip 261 and/or the ASIC 264. A mold compound 267 can encase the other illustrated elements within a single package. The ESD protection chip 261 can include ESD protection devices configured to provide energy associated with ESD events to storage elements of the storage chip 263. As illustrated, the ESD protection chip 261 and the storage chip 263 are arranged in a vertical stack with the ASIC 264. Insulating layers 262, such as dielectric or other die attach layers, are illustrated between the different chips in FIG. 26.

By having ESD protection devices on a separate chip from the ASIC 264, the ESD protection devices can be configured to handle ESD events having a greater magnitude than if the ESD protections devices were to be included on the ASIC 264. The ESD protection chip 261 is electrically connected to the storage chip 263. The storage chip 263 can be electrically connected to the ASIC 264. The electrical connections between chips in FIG. 26 can include wire bonds, through silicon vias, etc. The storage layer 263 can power the operation of the ASIC 264 using energy harvested from an ESD event. The integrated circuit system 260 can provide a system within a package where externally generated EOS events can be used to power the ASIC 264. Even if a relatively small amount of power is harvested from EOS events, the cumulative reduction in total system power can be significant in time if the total system included a relatively large number (e.g., hundreds or thousands) of vertically integrated systems.

Figure 27:
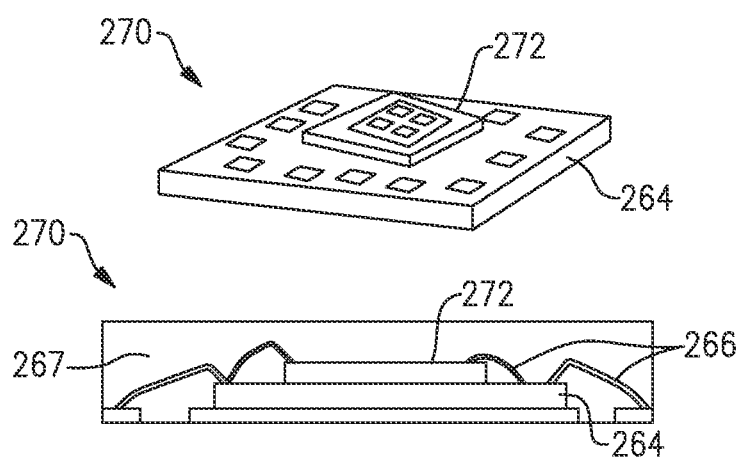
FIG. 27 is a schematic diagram of a vertically integrated system that includes electrical overstress protection and energy harvesting circuitry on a single chip according to an embodiment.

FIG. 27 is a schematic diagram of a vertically integrated system 270 that includes ESD protection and energy harvesting circuitry on a single chip according to an embodiment. A combined ESD protection and storage chip 272 includes circuitry capable of harnessing energy from ESD events and storage elements configured to store charge associated with the ESD events. Combined ESD protection and storage chip 272 can be stacked with an ASIC 264. Combining the ESD protection devices and storage elements in a single die can reduce height of the vertically integrated system relative to two separate die stacked in a pyramid configuration. Combining the ESD protection devices and storage elements in a single die can reduce the length and/or resistance of a path from a surge conduction point and storage elements relative to two separately stacked die. The ASIC 264 can receive charge from storage elements of the combined ESD protection and storage chip 272. Having the energy harvesting circuitry on a different chip than the ASIC can allow EOS protection devices, such as ESD protection devices, to be scaled up to store charge from larger EOS events, such as larger ESD events.

Figure 28:
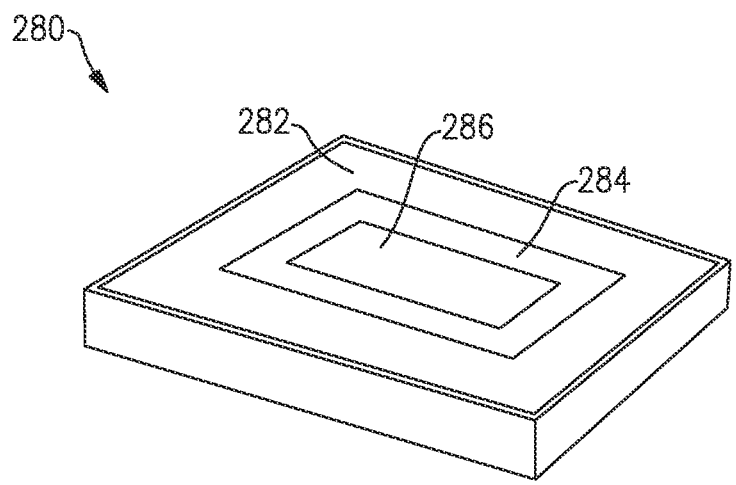
FIG. 28 illustrates a die with electrical overstress protection devices, storage elements, and processing circuitry according to an embodiment.

FIG. 28 illustrates a die 280 with EOS protection devices 282, storage elements 284, and processing circuitry 286 according to an embodiment. At a micro level, the EOS protection devices 282 can be segregated from the storage elements 284 and the processing circuitry 286 within the same die 280. In the illustrated embodiment, the die 280 is compartmentalized to deliver a system within a chip where the storage elements 284 are electrically connected to the processing circuitry 286 as a power source. As illustrated, the die 280 is partitioned into concentric type sections. The different sections of die 280 can be combined on a single semiconductor substrate, such as a silicon substrate. Trench isolation type fab processes where selective portions can be isolated from the substrate can be used to manufacture the different sections of the die 280.

Figure 29:
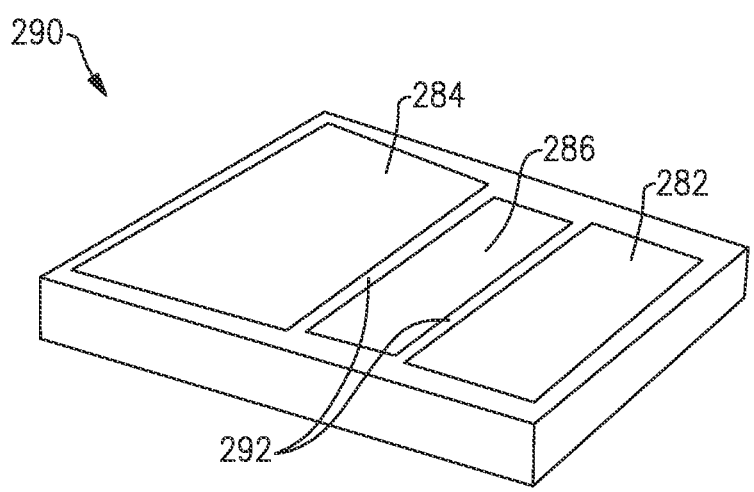
FIG. 29 illustrates a die with electrical overstress protection devices, storage elements, and processing circuitry according to another embodiment.

FIG. 29 illustrates a die 290 with EOS protection devices 282, storage elements 284, and processing circuitry 286 according to an embodiment. The die 290 includes a compartmentalized arrangement where the different sections of circuitry 282, 284, 286 are separated by an isolation barrier 292 and configured in a side by side arrangement. The isolation barrier 292 can include trench isolation. The trenches can includes insulating material, such as dielectric material. In an embodiment, an isolation layer can be included around some or all of the EOS protection devices of a compartmentalized die. Alternatively or additionally, an insulating layer, such as a dielectric layer, can cover the EOS protection devices 282 and/or the storage elements 284.

Figure 30A:
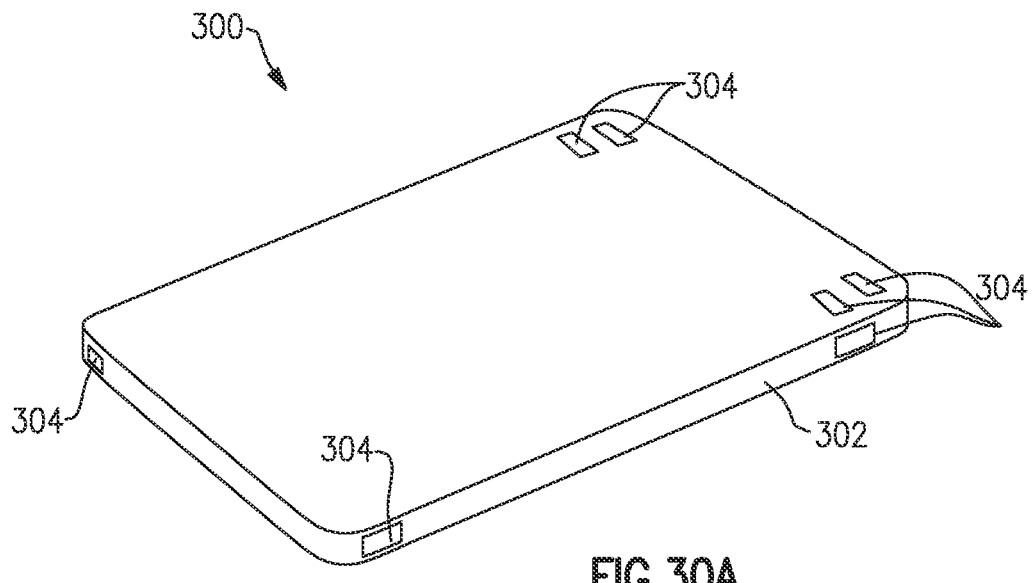
FIGS. 30A and 30B illustrate an embodiment of a mobile device that includes an external casing having conduits embedded within the external casing according to an embodiment.
Figure 30B:
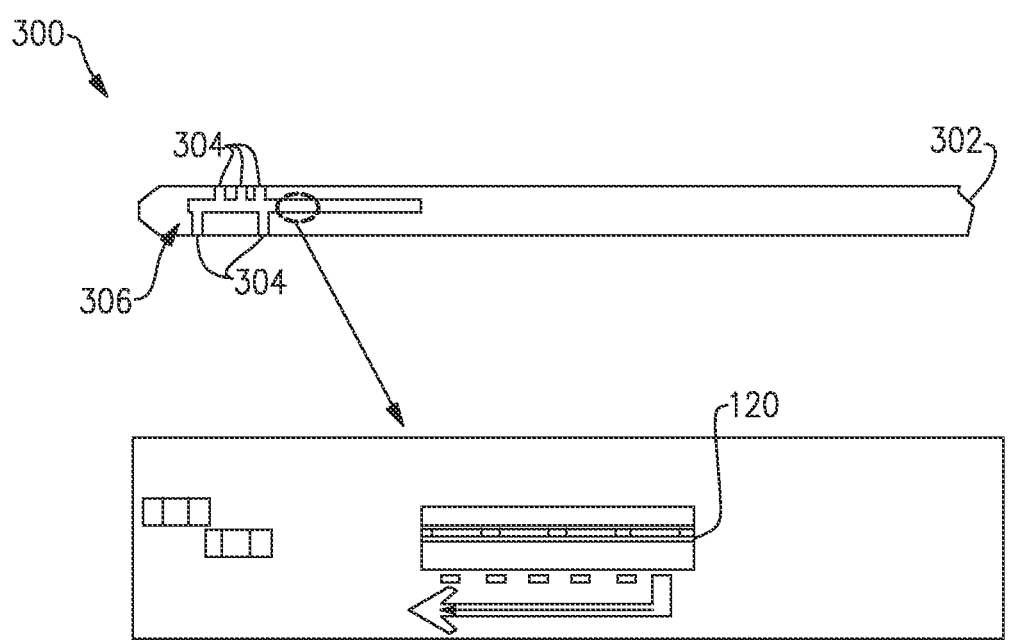

Energy harvesting circuitry can be implemented in mobile and/or wearable devices. FIGS. 30A and 30B illustrate an embodiment of a mobile device 300 that includes an external casing 302 having conduits 304 embedded within the external casing 302. Mobile devices, such as mobile phones and/or other handheld devices, can include conduits 304 that are arranged for harvesting external sources of charge, such as static charge. As shown in FIG. 30B, electrical connections 306 can route charge from conduits 304 to energy harvesting circuitry. The energy harvesting circuitry can be embodied in a system in a package 120 as illustrated. The external casing 302 can be configured to enhance and/or optimize the delivery of charge to the energy harvesting circuitry included within the external casing 302 of the mobile device.

Figure 30C:
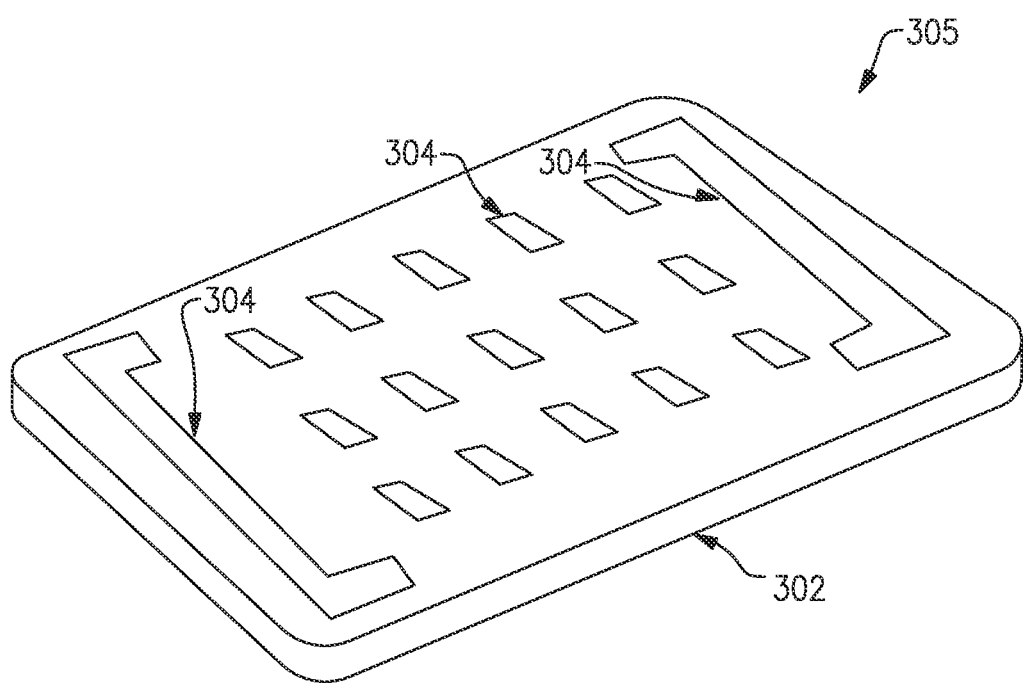
FIG. 30C illustrates an embodiment of a wearable device that includes an external casing having conduits embedded within the external casing according to an embodiment.

Any combination of features of the mobile device 300 can be applied to any suitable wearable device, such as a smart watch and/or a wearable healthcare monitoring device. For instance, any of the principles and advantages of the embodiments of FIGS. 30A and/or 30B can be applied to a wearable device. FIG. 30C illustrates a wearable device 305 with an external casing 302 and conduits 304. The wearable device 305 can be configured to be in contact with skin. The conduits 304 on the external casing 302 can be arranged to enhance and/or optimize the harvesting of charge from EOS events from external sources. The shape and/or arrangement of materials of the conduits 304 can enhance and/or optimize the harvesting of charge. For instance, any of the conduits 304 in any of FIGS. 30A to 30C can implement one or more features discussed in connection with FIG. 31 and/or FIGS. 33A to 33D.

In an embodiment, an energy harvesting system can be implemented in wearable device or another portable electronic device. The energy harvesting system can include conduits, ESD protection circuitry, a storage layer and a configuration circuit. The conduits can be arranged to efficiently channel ESD energy from an external source, such as ESD energy from contact with a person. The ESD protection circuitry configured to prevent a current spike and/or a voltage spike associated with an ESD event from damaging to other circuitry within the system. A storage layer can be configured to store the charge associated with the ESD event. The configuration circuit can configure the storage elements within the storage layer as desired to store charge associated with an ESD event.

The storage layer can also include ESD protection devices. The storage layer configuration circuit can control switches of the storage layer to select which storage element(s), such as capacitor(s), of the storage in which to store change associated with an ESD event. When one storage element is fully charged, the storage layer configuration circuit can adjust the state of switches such that charge associated with a subsequent ESD event is stored in another storage element. The conduits can be arranged such that the charge can only flow in one direction. The conduits can be configured to carry the maximum charge as efficiently as possible (e.g., in a circular or annular construction). The system can include a proximity sensor configured to detect a charged body. Responsive to detecting the charged body, the EDS protection circuitry can be configured and/or enabled. The system can include circuitry to recirculate charge from a storage element within the system and/or external to the system.

Figure 31:
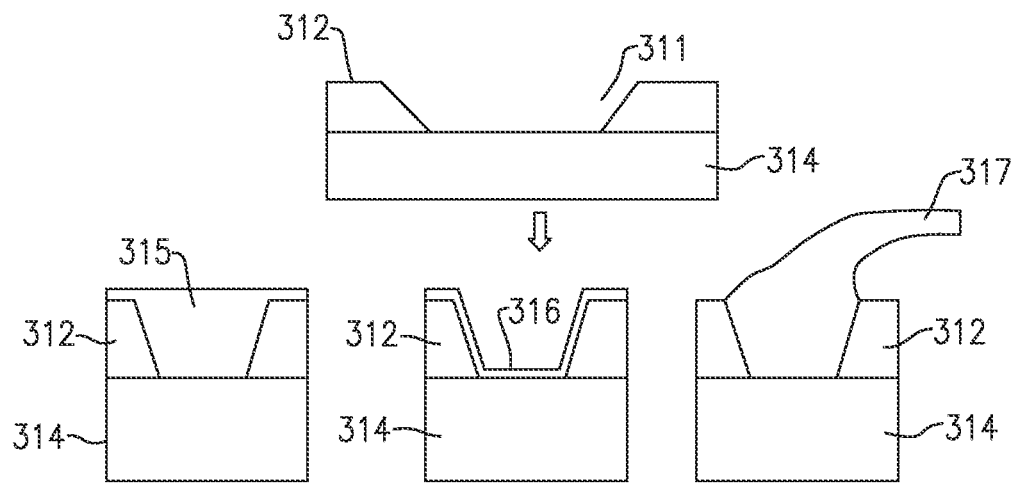
FIG. 31 illustrates examples of conductive structures in an opening of a package that can provide electrical connections to ESD protection devices according to various embodiments.

FIG. 31 illustrates examples of conductive structures of in an opening 311 of a package 312 to ESD protection devices 314 according to various embodiments. A conductive via 315 can be incorporated within the package 312 to provide signals associated with ESD events to an ESD protection device 314. Alternatively or additionally, conductive via 316 can be incorporated within the package 312 to provide signals associated with ESD events to an ESD protection device 314. Alternatively or additionally, a conductive connector 317 can be incorporated within the package 312 to provide signals associated with ESD events to an ESD protection device 314. The conductive structures of FIG. 31 are examples of electrical paths that can be enhanced and/or optimized for providing a signal associated with an ESD event for purposes of energy harvesting.

In some embodiments, electrical energy generation can result from rotating shafts and/or moving machine parts, for example, in industrial applications, vehicles, etc. Energy from electrical fields and/or static charge generated by rotating shafts and/or in industrial applications can generate electrical field flow and mobile carriers that can be stored by storage elements in accordance with the principles and advantages discussed herein. Example embodiments will be discussed with reference to FIGS. 32 to 33D.

Figure 32:
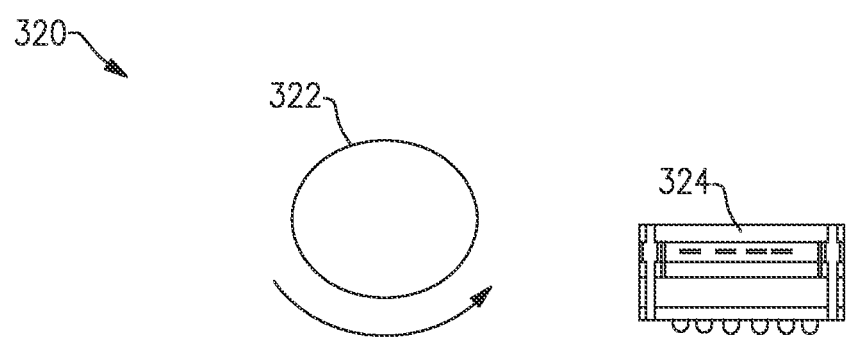
FIG. 32 illustrates a system that includes a rotating shaft and a charge harvesting system according to an embodiment.

FIG. 32 illustrates a system 320 that includes a rotating shaft 322 and a charge harvesting system 324 according to an embodiment. Rotation of the shaft 322 is a potential source of an electrical field and/or a static charge. The charge harvesting system 324 can include structures configured to conduct, store, and process the charge generated by rotation of the shaft 322. The charge harvesting system 324 can be placed at or near an optimal proximity to the shaft 322 for purposes of capturing charge. The charge harvesting system 324 can be in contact with the shaft 322 or a material thereon in certain applications. The charge generated and stored within the charge harvesting system 324 can then be re-circulated and/or used for another function and/or to power components within the charge harvesting system 324.

The charge harvesting system 324 can harvest energy from parts, such as shafts, that move to perform other functions. Accordingly, energy that would otherwise be lost in a system can be captured by the charge harvesting system 324. Existing equipment and/or machinery can be retrofitted with a charge harvesting system 324 to capture charge and re-circulate the captured charge to the system. Charge harvesting systems 324 can be incorporated into smart vehicles and/or electric vehicles such that, in certain circumstances (e.g., moving parts due to kinetic energy and/or physical momentum associated with going down a hill), charge can be generated and then stored and re-circulated within the vehicle.

The amount of charge generated by moving and/or rotating machinery can be enhanced and/or optimized by material selection. Materials used to construct moving parts can be selected along with other materials placed in close proximity to improve the intensity of the generated electrical field and/or amount of generated charge.

FIG. 33A illustrates a rotating shaft 322 having a layer of material 332 for enhancing an ESD field and/or charge generated by the rotating shaft and a charge harvesting system 324 having a layer of material 334 for enhancing an ESD field and/or charge generated. Surfaces of material 332 and the charge harvesting system 324 can be in physical contact with each other for an ESD field from the rotating shaft to be discharged to the charge harvesting system. Alternatively, the material 332 and the charge harvesting system 324 can be in close proximity to each other and a large enough charge to enable air-gap arcing can cause discharge from the rotating shaft to the charge harvesting system. Materials 332 and 334 can be selected and/or shaped to enhance and/or optimize charge generated by the shaft 332 and stored by the charge harvesting system 324. As shown in FIG. 33A, the rotating shaft 322 can have the layer of material 332 disposed around the circumference of the shaft 322. For instance, the layer of material 332 can be a ring and/or collar. The material 332 can be selected such that it maximizes the field generated when the shaft 322 is rotated in close proximity to the charge harvesting system 324, which can include another material layer 334 that can be exposed to the material 332. The charge harvesting system 324 can harvest ESD energy and can conduct the generated charge to the layers within the system. The charge can be stored in any of the storage elements discussed herein. The stored charge can then be circulated and/or applied to power up other operations within the charge harvesting system 324 and/or external to the charge harvesting system 324.

FIG. 33B illustrates that the layer of material 332' incorporated on the rotating shaft 322 can have a non-uniform width in certain embodiments. The width of the layer of material 332' can have a varying width as illustrated. The change in the width of the layer of material 332' can produce a discernible shift in the generated electric field between the layer of material 332' and the layer of material 334, which can be detected by the energy harvesting system 324. This measured change in the electrical field can be used in a number of ways, including to measure the revolutions per unit time of the shaft 322 based on the discernible change in electric field between the layers of material 332' and 334 as the shaft 322 rotates and/or to intentionally use the changing and/or intermittent peak nature of the electric field to electrically manipulate/move/operate the layers within the charge harvesting system 324 at defined periodic intervals.

Figure 33C:
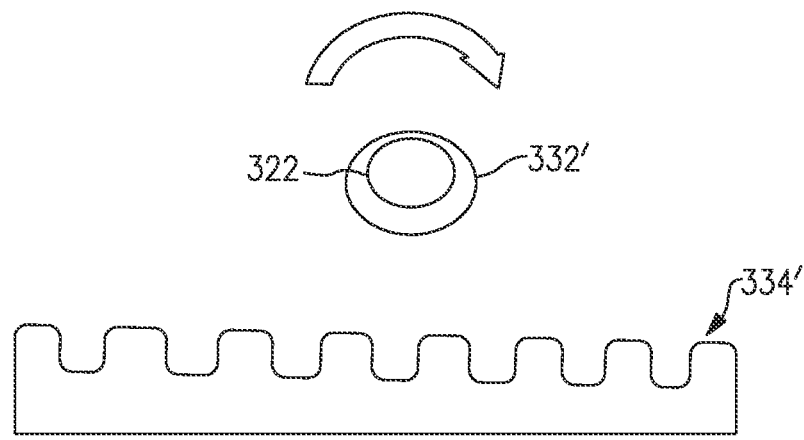
FIG. 33C illustrates a selected surface topography of the layer of material of the energy harvesting system according to an embodiment.

FIG. 33C illustrates a selected surface topography of the layer of material 334' of the energy harvesting system 324 according to an embodiment. The topography of the layer of material 334' can be modified relative to a planar layer to increase the surface area of the material exposed to the rotating shaft 322, for example, as illustrated. Accordingly, the electric field generated can be increased.

Figure 33D:
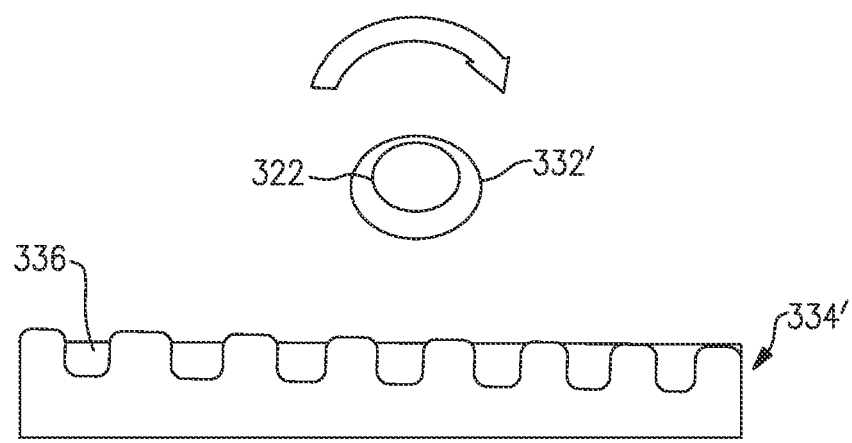
FIG. 33D illustrates a surface finish on the layer of material of the energy harvesting system according to an embodiment.

FIG. 33D illustrates a surface finish 336 on the layer of material 334' of the energy harvesting system 324 according to an embodiment. Recesses in the layer of material 334' can be filled with a surface finish material 336 to enhance and/or optimize charge associated with ESD events. The surface finish material 336 can be selected to optimize charge and/or electric field generated relative to the layer of material 332'. Accordingly the interaction and/or shape of the materials of the layers 332' and/or 334' and/or the surface finish 336 can optimize the electric field generated by the rotating shaft 322.

Various patterns and/or arrangements of the materials 332 and/or 334 can be implemented to enhance and/or optimize properties of electric fields and/or other electrical effects generated by the rotating shaft 322. Example patterns include concentric shapes, such as concentric circles or concentric squares, pyramidal stacked layers, rows of material with another material disposed over the rows of material, the like, or any combination thereof.

When two different materials are pressed or rubbed together, the surface of one material can generally capture some electrons from the surface of the other material. The material that captures electrons can have a stronger affinity for negative charge of the two materials, and that surface can be negatively charged after the materials are separated. Of course, the other material should have an equal amount of positive charge. If various insulating materials are pressed or rubbed together and then the amount and polarity of the charge on each surface is separately measured, a reproducible pattern can emerge. For insulators, Table 1 below can be used to predict which will become positive versus negative and how strong the effect can be. Such materials can be selected for purposes of generating charge in the embodiments of FIGS. 33A to 33D. Electroactive polymers are some other examples of materials that can be used in generating charge. Polarization can be inducted by electric field and polarization can modify the electric field. Accordingly, polarization can modify an intensity of an electric field.

TABLE 1

Typical Material Correction Factors

| Material | Correction Factor | Type of Metal |
|---|---|---|
| Steel (Fe360) | 1.0 | Ferrous |
| Stainless Steel | 0.6 . . . 1.0 | Non-Ferrous |
| Aluminum | 0.30 . . . 0.45 | Non-Ferrous |
| Brass | 0.35 . . . 0.50 | Non-Ferrous |
| Copper | 0.25 . . . 0.45 | Non-Ferrous |

Any of the principles and advantages described in connection with materials and/or patterns/arrangements of materials to enhance and/or maximize electric fields/generated charge can also be applied to monitor system utilization. For example, where the change in electric field generated by a material and/or a pattern/arrangement of materials can be proportional to a state, such as a particular state of operation of the system, information indicative of the state can be communicated remotely from the system. Such information can be used in monitoring the system.

Figure 33E:
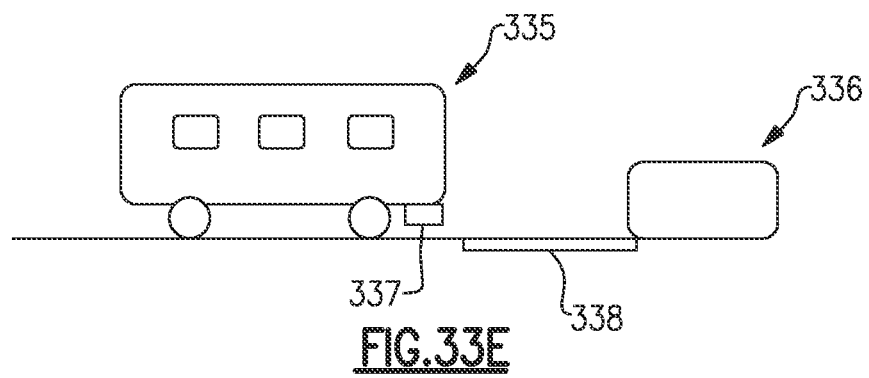
FIG. 33E is a block diagram of another context in which energy harvesting can be implemented according to an embodiment.

The principles and advantages discussed herein with reference to harvesting energy from EOS events can be applied to a variety of contexts in which an object carrying charge approaches another object. The object carrying charge can provide the EOS. For example, FIG. 33E is a block diagram of a context in which energy harvesting can be implemented according to an embodiment. In FIG. 33E, a vehicle 335 can approach a docking station 336. The docking station 336 can include EOS protection circuits and circuits to be protected. The docking station 336 can include energy harvesting circuitry and/or EOS detection and recording circuitry. The charge harvested by the docking station 336 can be used to power circuits of the docking station. In an embodiment, static charge generated by the vehicle 335 can be used to charge an electric vehicle, for instance, when the docking station 336 can perform a charging function. The vehicle 335 can include structures/materials 337 that can be configured to enhance and/or optimize a generated field in combination with another structure/material 338 associated with the docking station 338. The structures 337 and/or 338 can implement one or more features discussed above, for example, in connection with a rotating shaft. The vehicle 335 can include functional safety circuitry in certain implementations.

Responsive to detecting the vehicle 335 approaching the docking station 336, the energy harvesting circuitry and/or EOS detection and recording circuitry can be enabled and/or pre-conditioned. A proximity sensor, such as discussed below, can detect that the vehicle 335 (e.g., a car, a truck, a subway train, a train, a forklift, etc.) is approaching the docking station 336.

Smart storage aspects of harvesting changed associated with EOS events, such as switching on and off different capacitors, enabling protective circuitry, the act of sensing the presence of something, can be applied in a variety of contexts. For example, in the case of a smart/electric vehicle, smart storage circuitry, such as the storage circuitry of the electronic device 170 of FIG. 17, can be incorporated within a system whereby the charge/storage levels are recorded and/or transmitted wirelessly to implement a variety of functionalities. For instance, a fleet of "smart" forklifts/vehicles could be managed/monitored, for example, when stored charge of a specific vehicle gets to a certain level, the system can flags this and initiate a plans for the specific vehicle to recharge. As another example, within a "smart" vehicle when a storage level gets to a certain level this enables a "smarter" use of system power, such as temporarily turning off non-essential functionality. As another example, before/during docking a level of power within the storage system can be remotely transmitted to the docking station and this can enables more effective charging/energy management at the docking station. In another example, energy harvesting circuitry can harness and store the charge carried by a vehicle for use by the vehicle. In one other example, a docking station can harvest static charge generated by a vehicle and used the harvested charge to perform a charging function.

Energy harvesting circuitry and/or storage elements can be physically implemented in a variety of ways. FIGS. 36 to 41 provide illustrative physical embodiments of energy harvesting circuitry configured to store energy associated with EOS events in storage elements. Any of these embodiments can include EOS event detection circuitry. In these embodiments, exposed surfaces of EOS can, for example, include circular conducting structures or arrays of such circular conducting structures. Any of the principles and advantages discussed with reference to energy harvesting and storage layers, such as circuits, materials, layers, etc., can be implemented in connection with any of FIGS. 36 to 41.

Figure 36:
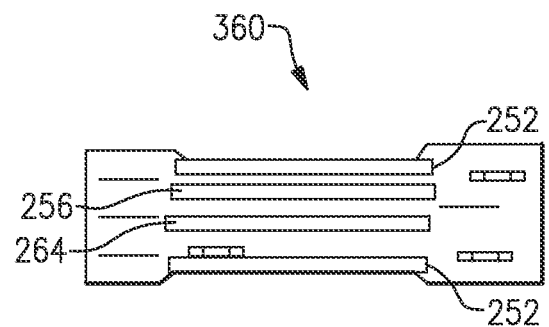
FIG. 36 illustrates an example electronic device with energy harvesting and storage and/or EOS event detection circuitry according to an embodiment.

In FIG. 36, electronic device 360 includes EOS protection layers 252 on opposing sides. The EOS protection layers 252 in this electronic device can harvest change on opposing sides of the electronic device. The EOS protection layers 252 can include EOS devices and/or other circuitry for generating charge associated with EOS events. Each of the EOS protection layers 252 can be connected to the storage layer 256, which includes storage elements to store the harvested charge. Insulating material can be included between each of the EOS protection layers 252 and the storage layer 256. In another embodiment, separate storage layers can be included for each EOS protection layer 252. As illustrated, the electronic device 360 also includes an ASIC 264.

Figure 37:
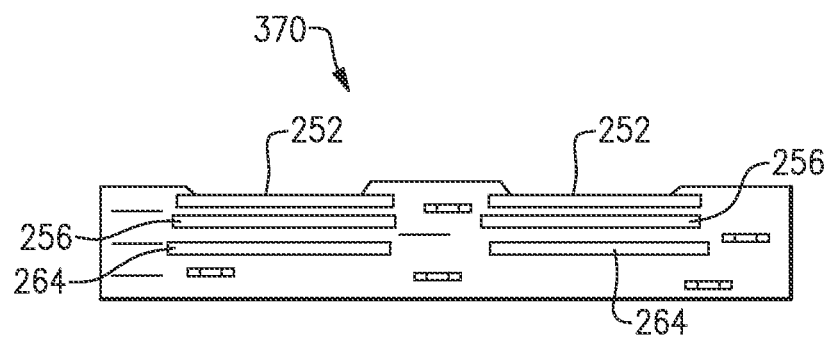
FIG. 37 illustrates an example electronic device with energy harvesting and storage and/or EOS event detection circuitry according to an embodiment.

In FIG. 37, the electronic device 370 includes side by side EOS protection layers 252. As illustrated, each of these EOS protection layers 252 are in electrical communication with a respective storage layer 256. The illustrated electronic device 370 includes separate vertical stacks of an EOS protection layer 252, a storage layer 256, and an ASIC 264.

Figure 38:
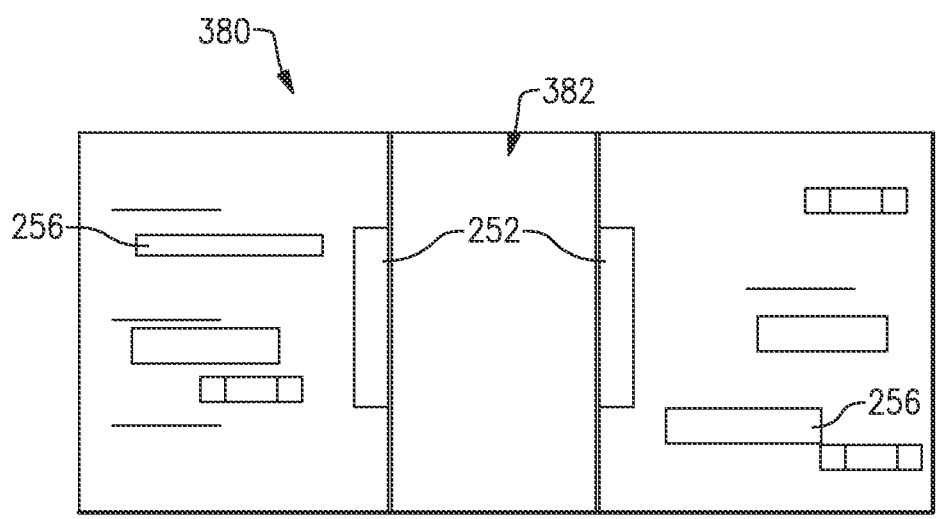
FIG. 38 illustrates an example electronic device with energy harvesting and storage and/or EOS event detection circuitry according to an embodiment.

The electronic device 380 of FIG. 38 includes an opening 382 through which EOS devices of the EOS layer 252 are exposed. Such a device can be used in a variety of different EOS event detection and/or EOS event harvesting applications.

Figure 39:
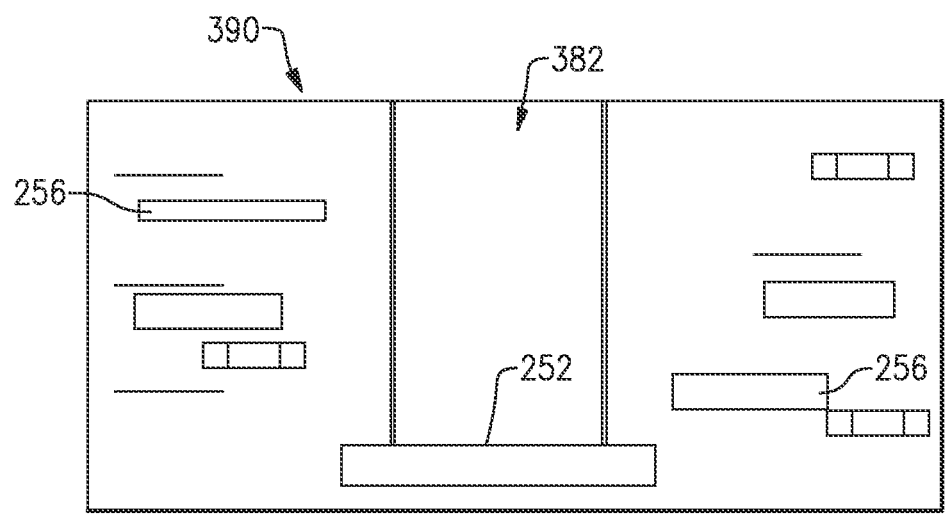
FIG. 39 illustrates an example electronic device with energy harvesting and storage and/or EOS event detection circuitry according to an embodiment.

The electronic device 390 of FIG. 39 includes an opening 392 through which EOS devices of the EOS layer 252 are exposed at the bottom of a recess. Such a device can be used in a variety of different EOS event detection and/or EOS event harvesting applications.

Figure 40:
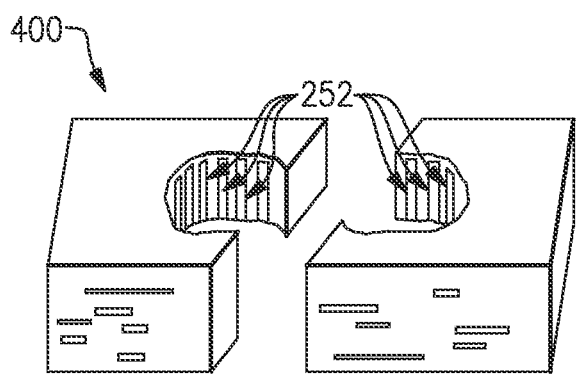
FIG. 40 illustrates an example electronic device with energy harvesting and storage and/or EOS event detection circuitry according to an embodiment.

The electronic device 400 of FIG. 40 includes EOS devices of EOS layers 252 within an opening between two sides of an embedded structure. Such a device can be used in a variety of different EOS event detection and/or EOS event harvesting applications.

Figure 41:
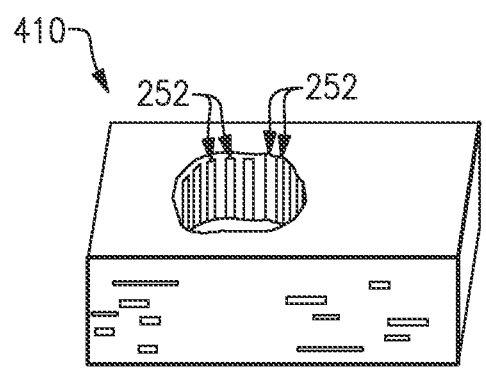
FIG. 41 illustrates an example electronic device with energy harvesting and storage and/or EOS event detection circuitry according to an embodiment.

The electronic device 410 of FIG. 41 includes EOS devices of EOS layers 252 within an opening/recess of an embedded structure. Such a device can be used in a variety of different EOS event detection and/or EOS event harvesting applications.

Proximity of an Electric Field and EOS Protection and/or Energy Harvesting Configuration As discussed above, aspects of this disclosure relate to detecting proximity of an electrical field and configuring circuitry for EOS protection and/or harvesting energy from an EOS event responsive to detecting proximity. Proximity sensing information can be used to configure EOS protection circuitry and/or energy harvesting circuitry configured to store energy associated with EOS events. Proximity sensing information can indicate proximity of an object in one, two, or three dimensions. The principles and advantages associated with using proximity sensing information to configure devices can be applied in connection with any of the other embodiments discussed herein. Illustrative embodiments related to proximity sensing will now be discussed.

FIG. 34 is a schematic block diagram of an illustrative electronic device that can configure EOS protection using proximity sensing information according to an embodiment. As illustrated, the electronic device 340 includes an input contact 10, an EOS protection device 11, a proximity sensor 342, and an EOS configuration circuit 344. The proximity sensor 342 can be any suitable sensor configured to sense proximity of an object to the electronic device 340. For instance, the proximity sensor 342 can be a capacitive sensor or a magnetic sensor in certain implementations. The proximity sensor 342 can provide proximity information to the EOS configuration circuit 344. The EOS configuration circuit 344 can enable EOS protection. The EOS configuration circuit 344 can configure the EOS protection device 11 based on the proximity information. Accordingly, the EOS protection device can be configured prior to an EOS event resulting from an object in proximity to the electronic device. The EOS configuration circuit 344 can, for example, provide active voltage clamping of the EOS protection device 11 and/or provide current to an actively controlled protection circuit, such as an actively controlled SCR.

According to certain embodiments, the EOS protection device 11 can be an ESD protection device. The EOS configuration circuitry 344 can pre-trigger and/or prime the ESD protection device to trigger responsive to the proximity information indicating that an ESD event is likely imminent. When there is a race condition between the ESD protection and the internal circuits to be protected, such pre-triggering and/or priming can ensure proper ESD protection of the internal circuits. Pre-triggering an ESD protection device can provide more robust ESD protection for fast ESD events, such as ESD events on the order of nanoseconds or less.

FIG. 35 is a schematic block diagram of an illustrative electronic device that can configure a storage element arranged to store energy associated with an EOS event using proximity sensing information according to an embodiment. As illustrated, the electronic device 350 includes an input contact 10, an EOS protection device 11, an EOS steering device 142, a storage element 144, a load 148, an output contact 149, a proximity sensor 342, and a storage element configuration circuit 354. In FIG. 35, the proximity sensor 342 can provide proximity information to the storage element circuit 344. The storage element configuration circuit 354 can configure the storage element 144 based on the proximity information. Accordingly, the storage element 144 can be configured prior to an EOS event resulting from an object in proximity to the electronic device. Based on the proximity information, particular capacitor(s) and/or other storage structure(s) of the storage element 144 can be switched in to capture charge associated with the EOS event. The particular capacitor(s) and/or other storage structure(s) that are switched in based on capacity to capture energy associated with an EOS event. The particular capacitor(s) and/or other storage structure(s) can later be switched out after the charge associated with the EOS event is captured.

CONCLUSION

The principles and advantages described herein can be implemented in various apparatuses. Examples of such apparatuses can include, but are not limited to, consumer electronic products, parts of the consumer electronic products, electronic test equipment, etc. Examples of parts of consumer electronic products can include clocking circuits, analog-to-digital converts, amplifiers, rectifiers, programmable filters, attenuators, variable frequency circuits, etc. Examples of the electronic devices can also include memory chips, memory modules, circuits of optical networks or other communication networks, and disk driver circuits. Consumer electronic products can include, but are not limited to, wireless devices, a mobile phone (for example, a smart phone), cellular base stations, a telephone, a television, a computer monitor, a computer, a hand-held computer, a tablet computer, a laptop computer, a personal digital assistant (PDA), a microwave, a refrigerator, a stereo system, a cassette recorder or player, a DVD player, a CD player, a digital video recorder (DVR), a VCR, an MP3 player, a radio, a camcorder, a camera, a digital camera, a portable memory chip, a washer, a dryer, a washer/dryer, a copier, a facsimile machine, a scanner, a wrist watch, a smart watch, a clock, a wearable health monitoring device, etc. Further, apparatuses can include unfinished products.

Unless the context clearly requires otherwise, throughout the description and the claims, the words "comprise," "comprising," "include," "including," and the like are to be construed in an inclusive sense, as opposed to an exclusive or exhaustive sense; that is to say, in the sense of "including, but not limited to." The words "coupled" or connected", as generally used herein, refer to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the Detailed Description using the singular or plural number may also include the plural or singular number, respectively. The words "or" in reference to a list of two or more items, is intended to cover all of the following interpretations of the word: any of the items in the list, all of the items in the list, and any combination of the items in the list. All numerical values provided herein are intended to include similar values within a measurement error.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states.

The teachings of the inventions provided herein can be applied to other systems, not necessarily the systems described above. The elements and acts of the various embodiments described above can be combined to provide further embodiments. The acts of the methods discussed herein can be performed in any order as appropriate. Moreover, the acts of the methods discussed herein can be performed serially or in parallel, as appropriate.

While certain embodiments of the inventions have been described, these embodiments have been presented by way of example only, and are not intended to limit the scope of the disclosure. Indeed, the novel methods and systems described herein may be embodied in a variety of other forms. Furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure. Accordingly, the scope of the present inventions is defined by reference to the claims.

What is claimed is:

1. A system for providing power from a plurality of sources, the system comprising:
    a plurality of storage elements configured to store charge, the plurality of storage elements comprising a first storage element and a second storage element;
    a plurality of switches comprising a first switch and a second switch, the first switch arranged in series with the first storage element, and the second switch arranged in series with the second storage element;
    an electrical overstress protection device configured to provide electrical overstress protection for the first storage element;
    a steering device configured to steer energy to one or more storage elements of the plurality of storage elements by way of one or more of the plurality of switches to thereby store charge; and
    a power source, wherein the system is configured to provide power from the power source, and wherein the system is configured to provide power from charge stored by the first storage element.

2. The system of claim 1, further comprising a monitoring circuit configured to monitor the charge stored by the plurality of storage elements.

3. The system of claim 2, further comprising a switch control circuit configured to turn on a selected switch of the plurality of switches based on information from the monitoring circuit, wherein the storage elements comprise a third storage element.

4. The system of claim 1, wherein the power source comprises a battery.

5. The system of claim 1, wherein at least one of the plurality of storage elements comprises a rechargeable battery.

6. The system of claim 1, wherein the system is configured to wirelessly transmit an indication of charge stored by the plurality of storage elements.

7. The system of claim 1, further comprising a reporting circuit configured to assert an alarm signal related to a functional safety risk of the system.

8. The system of claim 1, wherein the system is configured to initiate an action in response to an energy surge.

9. The system of claim 1, wherein the system is configured to provide power from the power source when the plurality of storage elements store less than a certain amount of charge.

10. The system of claim 1, wherein the system is configured to initiate an action in response to detecting stored charge reaching a certain level.

11. The system of claim 1, wherein the steering device is configured to steer an energy surge to the one or more storage elements.

12. The system of claim 1, wherein the electrical overstress protection device is configured to provide electrical overstress protection for the second storage element.

13. A system for providing power from a plurality of sources, the system comprising:
    a plurality of storage elements configured to store charge, the plurality of storage elements comprising a first storage element and a second storage element;
    a plurality of switches comprising a first switch and a second switch, the first switch arranged in series with the first storage element, and the second switch arranged in series with the second storage element, wherein the plurality of switches are configured to control the plurality of storage elements such that the first storage element discharges while the second storage element charges;
    an electrical overstress protection device configured to provide electrical overstress protection for the first storage element;
    a steering device configured to steer energy to one or more storage elements of the plurality of storage elements; and a power source, wherein the system is configured to provide power from the power source, and wherein the system is configured to provide power from charge stored by the first storage element.

14. The system of claim 13, wherein the steering device is configured to steer energy to the one or more storage elements of the plurality of storage elements by way of one or more of the plurality of switches to thereby store charge.

15. The system of claim 13, further comprising a reporting circuit configured to assert an alarm signal related to a functional safety risk of the system.

16. A system for providing power from a plurality of sources, the system comprising:
 a plurality of storage elements configured to store charge, the plurality of storage elements comprising a first storage element and a second storage element;
 an electrical overstress protection device configured to provide electrical overstress protection for the first storage element;
 a steering device configured to steer energy to one or more storage elements of the plurality of storage elements;
 a power source, wherein the system is configured to provide power from the power source, and wherein the system is configured to provide power from charge stored by the first storage element; and
 a moving part configured to generate charge from moving, wherein the plurality of storage elements are configured to store the charge generated by the moving part.

17. The system of claim 16, wherein the power source comprises a battery.

18. The system of claim 16, wherein the system is configured to wirelessly transmit an indication of charge stored by the plurality of storage elements.

19. The system of claim 16, wherein the system is configured to initiate an action in response to detecting stored charge reaching a certain level.

20. A system for providing power from a plurality of sources, the system comprising:
 a plurality of storage elements configured to store charge, the plurality of storage elements comprising a first storage element and a second storage element;
 an electrical overstress protection device configured to provide electrical overstress protection for the first storage element;
 a steering device configured to steer energy to one or more storage elements of the plurality of storage elements; and
 a power source, wherein the system is configured to provide power from the power source, wherein the system is configured to provide power from charge stored by the first storage element, and wherein the system is configured to toggle from providing power from the power source to providing power from the first storage element in response to detecting that the first storage element stores a sufficient amount of charge.

21. The system of claim 20, further comprising a plurality of switches comprising a first switch and a second switch, the first switch arranged in series with the first storage element, and the second switch arranged in series with the second storage element.

22. The system of claim 21, wherein the steering device is configured to steer energy to the one or more storage elements of the plurality of storage elements by way of one or more of the plurality of switches to thereby store charge.

23. The system of claim 20, further comprising a plurality of switches, wherein the steering device is configured to steer energy to the one or more storage elements of the plurality of storage elements by way of one or more of the plurality of switches to thereby store charge.

24. The system of claim 20, wherein the system is configured to initiate an action in response to an energy surge.

25. A method of providing power to a system from a plurality of sources, the method comprising:
 steering energy to one or more storage elements of plurality of storage elements to store charge to at least a first storage element of the plurality of storage elements;
 providing electrical overstress protection to the first storage element;
 providing power from the first storage element;
 providing power from a power source when the plurality of storage elements store less than a certain amount of charge, the power source being separate from the plurality of storage elements; and
 toggling from providing power from the power source to providing power from the first storage element in response to detecting that the first storage element stores a sufficient amount of charge.

26. The method of claim 25, further comprising initiating an action in response to detecting charge stored by the plurality of storage elements reaches a certain level.

27. The method of claim 25, wherein the power source comprises a battery.

28. The method of claim 25, further comprising wirelessly transmitting an indication of charge stored by the plurality of storage elements.

* * * * *